US008519540B2

(12) United States Patent
Chen et al.

(10) Patent No.: US 8,519,540 B2
(45) Date of Patent: Aug. 27, 2013

(54) SELF-ALIGNED DUAL DAMASCENE BEOL STRUCTURES WITH PATTERNABLE LOW-K MATERIAL AND METHODS OF FORMING SAME

(75) Inventors: Shyng-Tsong Chen, Albany, NY (US); Qinghuang Lin, Yorktown Heights, NY (US); Sampath Purushothaman, Yorktown Heights, NY (US); Terry A. Spooner, Albany, NY (US); Shawn M. Walsh, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 168 days.

(21) Appl. No.: 12/485,366

(22) Filed: Jun. 16, 2009

(65) Prior Publication Data

US 2010/0314767 A1 Dec. 16, 2010

(51) Int. Cl.
*H01L 23/48* (2006.01)

(52) U.S. Cl.
USPC .................................. 257/759; 257/E23.142

(58) Field of Classification Search
USPC .......... 257/759, E23.142, E21.575; 438/623, 438/598, 618
See application file for complete search history.

(56) References Cited

U.S. PATENT DOCUMENTS

| | | | |
|---|---|---|---|
| 4,371,605 A | 2/1983 | Renner | |
| 5,886,102 A | 3/1999 | Sinta et al. | |
| 5,939,236 A | 8/1999 | Pavelchek et al. | |
| 6,025,260 A | 2/2000 | Lien et al. | |
| 6,087,064 A | 7/2000 | Lin et al. | |
| 6,214,719 B1 | 4/2001 | Nag | |
| 6,291,333 B1 | 9/2001 | Lou | |
| 6,358,842 B1 | 3/2002 | Zhou et al. | |
| 6,455,416 B1 | 9/2002 | Subramanian et al. | |
| 6,492,256 B2 | 12/2002 | Lee et al. | |
| 6,492,732 B2 | 12/2002 | Lee et al. | |

(Continued)

FOREIGN PATENT DOCUMENTS

| | | |
|---|---|---|
| CA | 1204547 | 5/1986 |
| JP | 01293339 | 11/1989 |

OTHER PUBLICATIONS

Owe-Yang, D.C., et al., "Double exposure for the contact layer of the 65-nm node", Proc. SPIE, 2005, Adv. Resist Technology and Processing, vol. 5753, pp. 171-180.

(Continued)

*Primary Examiner* — Kimberly Rizkallah
*Assistant Examiner* — Duy T Nguyen
(74) *Attorney, Agent, or Firm* — Scully, Scott, Murphy & Presser, P.C.; Daniel P. Morris, Esq.

(57) ABSTRACT

A self-aligned interconnect structure is provided that includes a first patterned and cured low-k material located on a surface of a substrate, wherein the first patterned and cured low-k material includes at least one first interconnect pattern (via or trench pattern) therein. A second patterned and cured low-k material having at least one second interconnect pattern that is different from the first interconnect pattern is located atop the first patterned and cured low k material. A portion of the second patterned and cured low-k material partially fills the at least one first interconnect within the first patterned and cured low-k material. A conductive material fills the at least one first interconnect pattern and the at least one second interconnect pattern. A method of forming such a self-aligned interconnect structure is also provided.

17 Claims, 6 Drawing Sheets

(56) References Cited

U.S. PATENT DOCUMENTS

| | | |
|---|---|---|
| 6,514,667 B2 | 2/2003 | Angelopoulos et al. |
| 6,566,019 B2 | 5/2003 | Kling et al. |
| 6,780,753 B2 | 8/2004 | Latchford et al. |
| 6,787,469 B2 | 9/2004 | Houston et al. |
| 6,805,109 B2 | 10/2004 | Cowan |
| 6,861,180 B2 | 3/2005 | Chang |
| 6,861,367 B2 | 3/2005 | Gilton et al. |
| 7,015,133 B2 * | 3/2006 | Su et al. ............ 438/618 |
| 7,041,748 B2 | 5/2006 | Lin et al. |
| 7,056,840 B2 | 6/2006 | Miller et al. |
| 7,064,078 B2 | 6/2006 | Liu et al. |
| 7,071,532 B2 | 7/2006 | Geffken et al. |
| 7,091,611 B2 | 8/2006 | Ahn et al. |
| 7,138,329 B2 | 11/2006 | Lur et al. |
| 7,253,095 B2 | 8/2007 | Lur et al. |
| 7,306,853 B2 | 12/2007 | Lin et al. |
| 2001/0016412 A1 | 8/2001 | Lee et al. |
| 2002/0001952 A1 | 1/2002 | Chooi et al. |
| 2002/0163082 A1 | 11/2002 | Lee et al. |
| 2003/0073028 A1 | 4/2003 | Kim et al. |
| 2003/0129531 A1 | 7/2003 | Oberlander et al. |
| 2003/0198877 A1 | 10/2003 | Pfeiffer et al. |
| 2004/0048194 A1 | 3/2004 | Breyta et al. |
| 2004/0094821 A1 | 5/2004 | Lur et al. |
| 2004/0137241 A1 * | 7/2004 | Lin et al. ............ 428/447 |
| 2004/0151489 A1 | 8/2004 | Zhou |
| 2005/0093158 A1 | 5/2005 | Liu et al. |
| 2005/0095839 A1 | 5/2005 | Chang et al. |
| 2005/0170648 A1 * | 8/2005 | Tsai et al. ............ 438/687 |
| 2005/0263896 A1 | 12/2005 | Lur et al. |
| 2006/0028626 A1 | 2/2006 | Chang et al. |
| 2006/0228895 A1 | 10/2006 | Chae et al. |
| 2006/0258146 A1 | 11/2006 | Rantala et al. |
| 2007/0003841 A1 | 1/2007 | Choi |
| 2007/0020565 A1 | 1/2007 | Koh et al. |
| 2007/0054198 A1 | 3/2007 | Park |
| 2007/0148968 A1 | 6/2007 | Kwon et al. |
| 2007/0212649 A1 | 9/2007 | Lalbahadoersing et al. |
| 2007/0248899 A1 | 10/2007 | Choi |
| 2007/0281497 A1 | 12/2007 | Liu et al. |
| 2008/0173984 A1 | 7/2008 | Lin et al. |
| 2008/0286467 A1 | 11/2008 | Allen et al. |
| 2008/0299718 A1 | 12/2008 | Jiang et al. |
| 2009/0079075 A1 | 3/2009 | Lin et al. |
| 2009/0079076 A1 | 3/2009 | Lin et al. |
| 2009/0081418 A1 | 3/2009 | Allen et al. |
| 2009/0171014 A1 * | 7/2009 | Hergenrother et al. ....... 524/588 |
| 2009/0174067 A1 * | 7/2009 | Lin ................ 257/734 |
| 2009/0233226 A1 | 9/2009 | Allen et al. |
| 2009/0243018 A1 * | 10/2009 | Karkkainen ............... 257/437 |
| 2009/0291389 A1 * | 11/2009 | Allen et al. ................ 430/270.1 |

OTHER PUBLICATIONS

U.S. Appl. No. 12/569,200 entitled, "Patternable Low-K Dielectric Interconnect Structure With a Graded Cap Layer and Method of Fabrication", filed Sep. 29, 2009, first named inventor: Qinghuang Lin.

Notice of Allowance dated Nov. 29, 2012, received in a related U.S. Patent Application, namely U.S. Appl. No. 13/474,349.

Office Action dated Jul. 31, 2012, received in a related U.S. Patent Application, namely U.S. Appl. No. 13/474,349.

* cited by examiner

SELF-ALIGNED DUAL DAMASCENE BEOL STRUCTURES WITH PATTERNABLE LOW- K MATERIAL AND METHODS OF FORMING SAME

FIELD OF THE INVENTION

The present invention relates to semiconductor interconnect structures and methods of fabricating the same. Specifically, the present invention relates to self-aligned dual-damascene interconnect structures with patternable low-k dielectrics and methods of fabricating the same.

BACKGROUND

It is widely known that the speed of propagation of interconnect signals is one of the most important factors controlling overall circuit speed as feature sizes are reduced and the number of devices per unit area as well as the number of interconnect levels are increased. Throughout the semiconductor industry, there has been a strong drive to reduce the dielectric constant, k, of the interlayer dielectric (ILD) materials used to electrically insulate metal lines. As a result, interconnect signals travel faster through conductors due to a reduction in resistance-capacitance (RC) delays.

State-of-the-art semiconductor chips employ copper (Cu) as the electrical conductor and inorganic organosilicates as the low dielectric constant (low-k) dielectric, and have up to twelve levels of Cu/low-k interconnect layers. These Cu/low-k interconnect layers are fabricated with an iterative additive process, called dual-damascene, which includes several processing steps including, for example film deposition, patterning by lithography and reactive ion etching, liner (Cu barrier) deposition, Cu metal fill by electrochemical plating, and chemical-mechanical polishing of excessive Cu metal; these steps are described in greater detail in the following paragraphs.

When fabricating integrated circuit wiring within a multi-layer interconnect scheme, an insulating or dielectric material, e.g., silicon oxide or a low-k insulator will normally be patterned with at least several thousand openings to create conductive line openings and/or via openings using photo patterning and plasma etching techniques, e.g., photolithography with a photoresist subsequently followed by etching by plasma processes. These via and line openings are typically filled with a conductive metal material, e.g., aluminum, copper, or their alloys etc., to interconnect the active and/or passive elements of the integrated circuits. The semiconductor device is then polished to level its surface.

A continuous cap layer is then normally deposited over the planarized surface featuring the dielectric material and conductive metal material. Next, a dielectric material is deposited over the continuous cap layer, via and conductive line openings are created again within the dielectric layer as before, another conductive metal material is deposited within the openings and another continuous cap layer is deposited thereon. The process is repeated to fabricate a multi-layer interconnect wiring system. The multi-layer interconnect system built thereby is referred to in the art as a dual-damascene integration scheme.

Unfortunately, the strategy to introduce low-k materials (typically dielectrics whose dielectric constant is below that of silicon oxide) into advanced interconnects is difficult to implement due to the new materials chemistry of the low-k materials that are being introduced. Moreover, low-k materials exhibit fundamentally weaker electrical and mechanical properties as compared to silicon oxide. Further, the low-k dielectric alternatives are typically susceptible to damage during the various interconnect processing steps. The damage observed in the low-k materials is manifested by an increase in the dielectric constant and increased moisture uptake, which may result in reduced performance and device reliability.

Moreover, traditional dual-damascene integration suffers from via/line mis-alignment or "overlay error" during lithographic patterning. By "mis-alignment" it is meant the deviation from the perfect alignment (or overlay) of the subsequent line (or via) level to the via (or line) level thereunder in the dual-damascene integration which is intended to directly connect the line (via) level to the via (line) level directly below. Mis-alignment is due to the limitation of the lithographic tool employed or processing errors. The mis-aligned via/line causes degradation in performance, such as increasing the contact resistance of the metal line to the via, and deterioration in reliability of the resultant metal interconnects, due to enhancement of failure mechanisms such as electromigration.

One way to overcome the integration challenges of low-k materials mentioned above is to protect low-k materials by adding at least one sacrificial hardmask layer onto a surface of the low-k material. While the hardmask layer serves to protect the low-k material, the presence of the sacrificial hardmask layer adds enormous process complexity and manufacturing as additional film deposition, pattern transfer etch, and removal of the hardmask layers are needed.

A state-of-the-art back-end-of-the-line (BEOL) integration process, called a low temperature oxide (LTO) process, employs up to eight layers of sacrificial hardmask materials to fabricate a two-layer dual-damascene interconnect structure.

For example, a via-first LTO integration for forming a dual-damascene interconnect includes the steps of: depositing a dielectric material on a substrate including a patterned conductor; forming at least one via in the dielectric material, such that at least one of the vias is positioned over the patterned conductor; depositing a layer of planarizing material on the dielectric material and in the via; depositing a layer of barrier material on the layer of planarizing material; depositing at least one layer of imaging material on the layer of barrier material; forming at least one trench in the imaging material, barrier material and planarizing material, such that the at least one trench is positioned over the via; removing the imaging material, either after or concurrently with forming the trench in the planarizing material; transferring the at least one trench to the dielectric material, such that at least one of the trenches is positioned over the via; removing the barrier material, either after or concurrently with transferring the at least one trench to the dielectric material; and removing the planarizing material.

A line-first LTO integration for forming a dual-damascene interconnect structure includes the steps of: depositing a dielectric material on a substrate including a patterned conductor; forming at least one trench in the dielectric material, such that the at least one trench is positioned over the patterned conductor; depositing a layer of planarizing material on the dielectric material and in the trench; depositing a layer of barrier material on the layer of planarizing material; depositing at least one layer of imaging material on the layer of barrier material; forming at least one via in the imaging material, barrier material and planarizing material, such that at least one of the vias is positioned over the trench and the patterned conductor; removing the imaging material, either after or concurrently with forming the via in the planarizing material; transferring the at least one via to the dielectric material, such that at least one of the vias is positioned over the trench and the patterned conductor; removing the barrier material, either after or concurrently with transferring the at least one via to the dielectric material; and removing the planarizing material.

The prior art dual-damascene integration schemes, such as the LTO one mentioned above, are very complex, inefficient, and costly. For example, the via-first LTO integration scheme requires ten layers of films and twenty-one process steps to form a two-layer dual-damascene dielectric structure. In other words, 80% of the films are not needed in the final interconnect structure.

Although immensely popular in semiconductor manufacturing, the prior art dual-damascene integration scheme described above suffers from several drawbacks including, for example:

(I) First, it constitutes a significant portion of manufacturing cost of advanced semiconductor chips as many layers, up to twelve layers for the state-of-the-art chips, are required to connect the minuscule transistors within a chip and to the printed circuit board.

(II) Second, it is a main yield detractor as the many layers of films required to form the interconnects generate chances for defect introduction and, thus, degrade manufacturing yields.

(III) Third, it is very inefficient and embodies enormous complexity. The current dual-damascene integration scheme requires many sacrificial films (80% of the film stack) to pattern and protect the fragile interlayer dielectric films from damage during processing. These sacrificial patterning and protective films have to be removed after patterning and copper plating.

(IV) Fourth, the performance gain by introduction of new lower-k materials is often offset by the need for higher-k non-sacrificial protective materials, such as a cap layer, a hardmask layer, or a thicker copper barrier layer.

(V) Fifth, the prior art complex dual-damascene process lengthens manufacturing turn-around time and R&D development cycle.

(VI) Sixth, the plasma etching process is an expensive and often unreliable process and requires significant up-front capital investment.

(VII) Seventh, the aforementioned misalignment between vias and lines during the dual-damascene fabrication can cause degradation in performance and reliability of the resultant chips.

In view of the above, there is a need to simplify the dual-damascene formation of interconnects, including low-k dielectrics for improved performance, reliability, cost-saving and manufacturing efficiency without misalignment between vias and lines.

BRIEF SUMMARY

The problems described above in prior art processes of fabricating dual-damascene interconnect structures are solved by using a dramatically simplified integration method. In particular, a self-aligned method for forming dual-damascene interconnect structures that are part of integrated circuits and microelectronic devices with patternable low-k materials are provided herein.

In one embodiment of the self-aligned dual-damascene fabrication process, a first enlarged interconnect pattern is formed within a first patternable low-k material to a dimension that is no less than the sum of its design dimension and the mis-alignment margin or overlayer error, but no more than the dimension such that the first interconnect pattern will be in contact with its nearest neighbor first interconnect pattern. Subsequently, a second interconnect pattern that is different from the first interconnect pattern is formed within a second patternable low-k material to the design dimension of the second interconnect pattern and the second patternable low-k material partially fills the enlarged first interconnect pattern below. A post patterning cure of at least the second interconnect pattern leads to the formation of self-aligned dual-damascene interconnect structures. Both the first interconnect pattern and the second interconnect pattern are formed without utilizing a separate photoresist material.

The term "critical dimension or CD" denotes the smallest dimension of a particular level of a chip that a lithographic tool may print. In 2009, it is about 40 nm. The term "design dimension" denotes the specified dimension of a metal feature of interest for a device layer. The terms "mis-alignment margin or overlay error" denote the allowable discrepancy (in length unit) between the actual alignment or overlayer of line (or via) level relative to the underlying via (or line) level and a perfect alignment (or overlay). The target value for this margin is determined by performance and reliability requirements as described above, while the margin achieved in practice is limited by the capability of lithographic tools to precisely align reference marks in lithographic masks to reference marks on product wafers with patterns from preexisting fabrication levels.

The other drawbacks mentioned above with prior art dual-damascene processing are circumvented in this disclosure by combining the functions of a photoresist and a dielectric material into one material. This one material, called a photo-patternable low-k material (or patternable low-k material for short), acts as a photoresist during the lithographic patterning process, and as such, no separate photoresist is required. After lithographic patterning, the patternable low-k material is subsequently converted into a low-k material during a post patterning cure. In this way, plasma etching and the complex sacrificial film stack and processes required for conventional patterning are avoided. The method described herein also avoids the performance and reliability degradation due to via/trench misalignment in traditional dual-damascene fabrication.

Specifically, a simplified method of fabricating dual-damascene low-k interconnect structures with at least one negative-tone patternable low-k material and/or at least one positive-tone patternable low-k material is provided. This aspect of the present invention includes providing a first patternable low-k material on top of a substrate. At least one first interconnect pattern (via or trench) is then formed within the first patternable low-k material without utilizing a separate photoresist material, wherein the at least one first interconnect pattern has a first dimension that is larger than a second dimension of a final first interconnect pattern. Next, a second patternable low-k material is provided on top of the first patternable low-k material including within the at least one first interconnect pattern and thereafter at least one second interconnect pattern (via or trench not used as the first interconnect pattern) is formed within the second patternable low-k material without utilizing a separate photoresist material, wherein a portion of the second patternable low-k material remains in the at least one first interconnect pattern of the first dimension to provide the final first interconnect pattern having the second dimension and self-aligned to the at least one second interconnect pattern. Next, at least the second patternable low-k material is cured into a dielectric material having a dielectric constant of not more than 4.3 and thereafter the final first interconnect pattern and the second interconnect pattern are filled with a conductive material. In one embodiment of the invention, the first interconnect pattern is a via pattern and the second interconnect pattern is a trench pattern.

In some embodiments, an antireflective coating is formed on the substrate prior to forming the first patternable low-k material. In another embodiment, a material stack comprising a dielectric cap and an antireflective coating is formed on top of the substrate prior to forming the first patternable low-k material. When such materials are present, a step of forming contact holes through the antireflective coating or material stack may be performed after forming the at least one second interconnect pattern within the second patternable low-k material. The contacts holes enable subsequent contact to the underlying substrate.

In yet other embodiments, a curing step is performed after providing the at least one first interconnect pattern to the first patternable low-k material, wherein the at least one first interconnect pattern has a post-curing first dimension that is larger than a second dimension of a final first interconnect pattern.

A planarization process such as chemical mechanical polishing may follow the step of filling the first and second interconnect patterns, i.e., the via and trench patterns, with a conductive material.

In an even further embodiment, a dielectric cap is formed atop the cured second patternable low-k material after filling and planarizing.

This patternable low-k method mentioned above dramatically reduces the complexity and avoids the performance and reliability degradation in the prior art fabrication of interconnect structures. The photoresist and all other sacrificial materials and their related deposition, pattern transfer (etch) and removal process used in the prior art integration are no longer needed. In addition, the need for plasma etching steps, which are typically used in prior art patterning processes, are minimized. The reduced use of plasma etching steps reduces plasma-induced dielectric material damage, thus maintaining the performance gain for the introduction of lower dielectric constant on-chip insulators. It is further observed that the method mentioned above reduces the number of layers required to fabricate an interconnect structure and, as such, reduces the time and cost of fabricating interconnect structures as compared to prior art processes. In some embodiments of the invention, and when an ARC is used, the ARC and the patternable low-k material are part of a permanent dielectric material stack of the interconnect structure. It is further observed that the partially filled first interconnect pattern during the subsequent patterning of the second interconnect pattern level becomes a permanent dielectric material stack of the interconnect structure.

In addition to the methods described above, self-aligned dual-damascene interconnect structures are also disclosed which include the patternable low-k materials in a cured state; in the cured state the patternable low-k materials serve as the interconnect dielectrics. In these self-aligned dual-damascene interconnect structures, the first interconnect patterns, typically the vias, are partially filled during the subsequent patterning of the second interconnect pattern level, typically the trench. Specifically, through the use of appropriately sized via features and trench features, it is ensured that the contact between the two features is always self aligned as will be described in detail later. This is a unique result enabled only by the use of photo-patternable permanent dielectric materials to form these features. In some embodiments, an ARC is also present and remains as a permanent material within the interconnect structure.

In general terms, an interconnect structure is provided that includes a first patterned and cured low-k material located on a surface of a substrate, wherein the first patterned and cured low-k material includes at least one enlarged first interconnect pattern therein; a second patterned and cured low-k material is provided having at least one second interconnect pattern to the design dimension located atop the first patterned and cured low-k material, wherein a portion of second patterned and cured low-k material partially fills the at least one first interconnect pattern within the first patterned and cured low-k material; and a conductive material filing the at least one first interconnect pattern and the at least one second interconnect pattern. In the interconnect structures, the first interconnect pattern is either a trench pattern or via pattern, and the second interconnect pattern is the other of the trench pattern or the via pattern not present used as the first interconnect pattern.

In one embodiment, the first and second patterned and cured low-k materials are the same or different and comprise a polymer, a copolymer, or a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

In yet another embodiment of the present invention, an antireflective coating that is patterned is located between the substrate and the first patterned and cured low-k material. In a further embodiment, a dielectric cap is located on top of the substrate. In still another embodiment, another dielectric cap can be present atop the second patterned and cured low-k material.

BRIEF DESCRIPTION OF THE SEVERAL VIEWS OF THE DRAWINGS

FIG. 1A is after via patterning and FIG. 1B is after trench patterning.

DETAILED DESCRIPTION

Figure 1A:
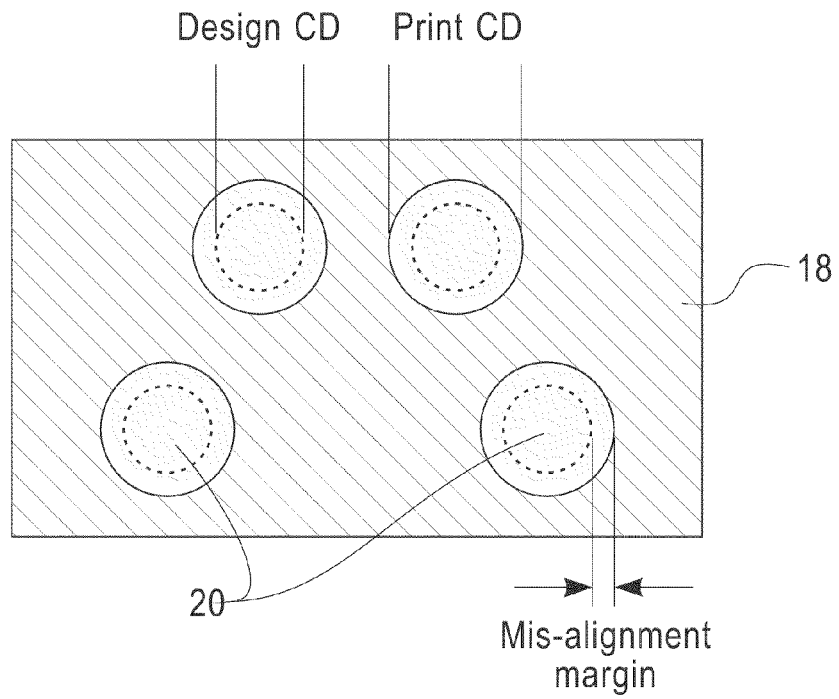
FIGS. 1A-1B are pictorial representations (top-down views) depicting formation of a self-aligned dual-damascene interconnect structure with patternable low-k dielectrics in accordance with an embodiment of the invention.

The present invention, which provides self-aligned dual-damascene low-k interconnect structures with a positive-tone or a negative-tone patternable dielectric and optionally, an antireflective coating (ARC), and methods of fabricating such interconnect structures, will now be described in greater detail by referring to the following discussion and drawings that accompany the present application. It is noted that the drawings that accompany the present application are provided for illustrative purposes only, and, as such, these drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known materials, structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As mentioned above, the patternable low-k materials employed herein are materials that first act as a photoresist during a patterning process and then act as a low-k dielectric insulator after a post patterning cure process. The cured product of a patternable low-k material, therefore, can serve as an on-chip dielectric insulator. The terms "cure" or "curing" are used interchangeable to refer to one of the processes selected from a thermal cure, an electron beam cure, an ultra-violet (UV) cure, an ion beam cure, a plasma cure, a microwave cure or a combination thereof. A "cured" product of a patternable low-k material is the product of the patternable low-k material after it has undergone one of the aforementioned cure processes. The "cured" product of a patternable low-k material is different from the patternable low-k material in chemical nature and physical, mechanical and electrical properties.

As stated above, the prior art drawbacks of current integration are circumvented herein by combining the functions of a photoresist and a dielectric material into one material. This one material, called a patternable low-k material herein, acts as a photoresist during the lithographic patterning process and, as such a separate photoresist is not required or used herein. After lithographic patterning, the patternable low-k material is subsequently converted into a low-k material with a post patterning cure. In this way, the method disclosed herein reduces the need for plasma etching and the complex sacrificial film stack and processes required for patterning.

Additionally, the via/line mis-alignment problem described above in prior art dual-damascene processes is overcome in one embodiment (See FIGS. 1A and 1B) by forming enlarged vias 20 into a first patternable low-k material 18 that have a first dimension (labeled as Print CD in FIG. 1A) that is larger than a second dimension (labeled as Design CD in FIG. 1A) of a final interconnect via pattern. The first dimension of the first patternable low-k material is no less than the sum of the design via dimension (labeled as Design CD in FIG. 1A) and the mis-alignment margin or overlayer error (labeled as mis-alignment margin in FIG. 1A), but no more than the dimension such that the via will be in contact with its nearest neighbor vias. Next, a second patternable low-k material 22 is applied atop the first patterned low-k material 18 having at least one enlarged via, wherein the second patternable low-k material 22 fills and planarizes the enlarged vias 20. During formation of a trench pattern 24 within the second patternable low-k material 22 some portion of the second patternable low-k material remains (labeled as 22A in FIG. 1B) in the enlarged vias 20 reducing the dimension of the enlarged via pattern 20 from a first dimension to a second dimension which is close the design via dimension. Thus, self-aligned dual-damascene interconnect structures are formed.

Reference is now made to FIGS. 2A-2G which illustrate an embodiment of the present invention in which a self-aligned dual-damascene structure is provided using patternable dielectrics as on-chip electrical insulators on a semiconductor chip. In the illustrated embodiment, a material stack including a dielectric cap 14 and an ARC 16 are shown. Although both layers 14 and 16 are shown, the present invention also works without either layer present, or with ARC 16 or dielectric cap 14 present only.

Figure 2A:
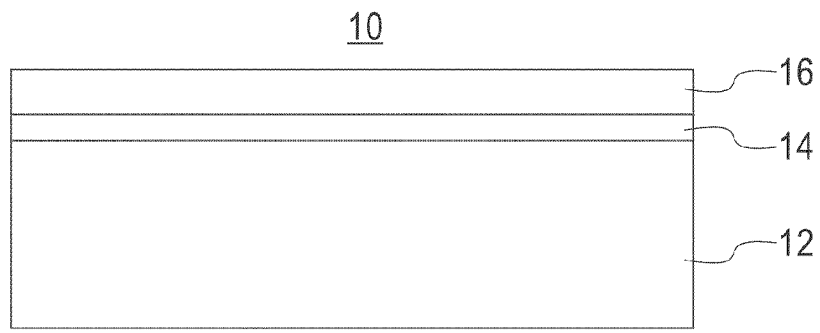
FIGS. 2A-2G are pictorial representations (through cross sectional views) depicting the basic processing steps employed in one embodiment for fabricating a dual-damascene interconnect structure using patternable dielectrics as on-chip electrical insulators on a semiconductor chip.

FIG. 2A illustrates an initial structure 10 that is utilized in this embodiment. The initial structure 10 includes a substrate 12, an optional dielectric cap 14 located on a surface of substrate 12, and optional antireflective coating 16 located on a surface of the optional dielectric cap 14.

The substrate 12 may comprise an electrically semiconducting material, an insulating material, a conductive material, devices or structures made of these materials or any combination thereof (e.g., a lower level of an interconnect structure). When the substrate 12 is comprised of a semiconducting material, any semiconductor such as Si, SiGe, SiGeC, SiC, Ge alloys, GaAs, InAs, InP and other III/V or II/VI compound semiconductors, or organic semiconductors may be used. The substrate 12 may also be a flexible substrate containing devices that are suitable for high-speed roll-to-roll processing. In addition to these listed types of semiconducting materials, substrate 12 may also be a layered semiconductor such as, for example, Si/SiGe, Si/SiC, silicon-on-insulators (SOIs) or silicon germanium-on-insulators (SGOIs). These semiconductor materials may form a device, or devices or structures, which may be discrete or interconnected. These devices and device structures may be for computation, transmission, storage or display of information, such as logic devices, memory devices, switches or display devices.

When the substrate 12 is an electrically insulating material, the insulating material can be an organic insulator, an inorganic insulator or a combination thereof including multilayers. The substrate 12 may also include a patternable low-k dielectric material as well. These electrically insulating materials may be part of a device, or devices or structures, which may be discrete or interconnected. These devices and structures may be for logic applications or memory applications. When the substrate 12 is an electrically conducting material, the substrate may include, for example, polySi, an elemental metal, an alloy including at least one elemental metal, a metal silicide, a metal nitride or combinations thereof including multilayers. When the substrate 12 comprises a semiconducting material, one or more semiconductor devices such as, for example, complementary metal oxide semiconductor (CMOS) devices, strained silicon devices, carbon-based (carbon nanotubes and/or graphene) devices, phase-change memory devices, magnetic memory devices, magnetic spin switching devices, single electron transistors, quantum devices, molecule-based switches and other switching or memory devices that can be part of an integrated circuit, can be fabricated thereon.

The optional dielectric cap 14 is formed directly on the surface of substrate 12 utilizing a conventional deposition process such as, for example, chemical vapor deposition (CVD), plasma enhanced chemical vapor deposition (PECVD), atomic layer deposition (ALD)), chemical solution deposition (such as spin coating), or evaporation. The dielectric cap 14 comprises any suitable dielectric capping material such as, for example, SiC, SiN, $SiO_2$, a carbon doped oxide, a nitrogen and hydrogen doped silicon carbide SiC(N, H) or multilayers thereof. Dielectric cap 14 may be a continuous layer or a discontinuous layer. Dielectric cap 14 may also be a layer with graded composition in the vertical direction, or dielectric cap 14 may be a select cap, such as CoWP.

After the deposition of the dielectric cap 14, a post deposition treatment may be applied to modify the properties of either the entire layer or the surface of the dielectric cap 14. This post deposition treatment can be selected from heat treatment, irradiation of electromagnetic wave (such of ultraviolet light), particle beam (such as an electron beam, or an ion beam), plasma treatment, chemical treatment through a gas phase or a liquid phase (such as application of a monolayer of surface modifier) or any combination thereof. This post-deposition treatment can be blanket or pattern-wise. The post deposition treatment enhances the chemical, physical, electrical, and/or mechanical properties of the dielectric cap 14, such as adhesion strength. The chemical properties include nature and/or location of surface functional groups, and hydrophilicity. The physical properties include density, moisture absorption, and heat conductivity. The mechanical properties include modulus, hardness, cohesive strength, toughness, resistance to crack and adhesion strength to its neighboring layers. The electrical properties include dielectric constant, electrical breakdown field, and leakage current.

The heat treatment should be no high than the temperature that the underlying substrate can withstand, usually 500° C. This heat treatment can be conducted in an inert environment or within a chemical environment in a gas phase or a liquid phase. This treatment step may or may not be performed in the same tool as that used in forming the dielectric cap 14.

The post deposition treatment by irradiation of electromagnetic wave can be by ultra-violet (UV) light, microwave and the like. The UV light call be broadband with a wavelength range from 100 nm to 1000 nm. It can also be UV light generated by an excimer laser or other UV light source. The UV treatment dose can be a few $mJ/cm^2$ to thousands of $J/cm^2$. This irradiation treatment can be conducted at ambient temperature or at an elevated temperature no higher than 500° C. This irradiation treatment can be conducted in an inert environment or within a chemical environment in a gas phase or a liquid phase. The following conditions may be employed in some embodiments of the present invention: a radiation time from 10 sec to 30 min, a temperature from room temperature to 500° C., and an environment including vacuum, or gases such as, for example, inert gas, $N_2$, $H_2$, $O_2$, $NH_3$, hydrocarbon, and $SiH_4$. This treatment step may or may not be performed in the same tool as that used in forming the dielectric cap 14.

The post deposition treatment by plasma treatment can be selected from oxidizing plasma, reducing plasma or a neutral plasma. Oxidizing plasmas include, for example, $O_2$, CO, and $CO_2$. Reducing plasmas include, for example, $H_2$, $N_2$, $NH_3$, and $SiH_4$. The neutral plasmas include, for example, Ar and He. A plasma treatment time from 1 sec to 10 min and a plasma treatment temperature from room temperature to 400° C. can be employed. This treatment step may or may not be performed in the same tool as that used in forming the dielectric cap 14.

The post deposition chemical treatment may be conducted in a gas phase or a liquid phase. In one embodiment, the following conditions may be employed: a treatment time from 1 sec to 30 min, a temperature from room temperature (i.e., from 20° C. to 30° C.) to 500° C. Chemicals suitable for this chemical treatment may be selected from any chemicals that improve chemical, physical, electrical, and/or mechanical properties of the dielectric cap layer, such as adhesion strength. This chemical treatment may penetrate the entire layer of dielectric cap 14 or is limited only to the surface of the dielectric cap 14. Example chemicals include adhesion promoters such as silanes, siloxanes and silylation agents. This treatment step may or may not be performed in the same tool as that used in forming the dielectric cap 14.

The thickness of the dielectric cap 14 may vary depending on the technique used to form the same as well as the material make-up of the layer. Typically, the dielectric cap 14 has a thickness from 2 nm to 55 nm, with a thickness from 10 nm to 45 nm being more typical.

Next, an optional antireflective coating (ARC) 16 is formed on a surface of the optional dielectric cap 14 if present, or directly on a surface of the substrate 12 when the dielectric cap 14 is not present. In one embodiment, it is preferred to include the ARC 16 within the inventive structure. ARC 16 may be a single layer, multilayer or a graded layer with a composition that varies along the vertical direction.

The ARC 16 employed has the following general characteristics: (i) It acts as an antireflective coating (ARC) during a lithographic patterning process; (ii) It withstands high-temperature BEOL integration processing (up to 500° C.); (iii) It prevents resist (e.g., the patternable low-k material) poisoning by the substrate; (iv) It provides vertical wall profile and sufficient etch selectivity between the patternable low-k material and the ARC layer; (v) It serves as a permanent dielectric layer in a chip (low dielectric constant, preferably k<5, more preferably k<3.6); and (vi) It is compatible with conventional BEOL integration and produces reliable hardware.

Further discussion is now provided for characteristics (i)-(v).

Characteristic (i) ARC 16 acts as an antireflective coating (ARC) during a lithographic patterning process: ARC 16 may be designed to control reflection of light that is transmitted through the patternable low-k material (to be subsequently formed), reflected off the substrate 12 and back into the patternable low-k material, where it can interfere with incoming light and cause the patternable low-k material to be unevenly exposed. The ARC's optical constants are defined here as the index of refraction n and the extinction coefficient k. In general, ARC 16 can be modeled so as to find optimum optical parameters (n and k values) of the ARC as well as optimum thickness. The preferred optical constants of ARC 16 are in the range from n=1.2 to n=3.0 and k=0.01 to k=0.9, preferably n=1.4 to n=2.6 and k=0.02 to k=0.78 at a wavelength of 365, 248, 193 and 157, 126 nm and extreme ultraviolet (13.4 nm) radiation. The optical properties and thickness of ARC 16 are optimized to obtain optimal resolution, profile control and to maximize process window of the patternable low-k material during the subsequent patterning steps, which is well known to those ordinarily skilled in the art.

Characteristic (ii) ARC 16 can withstand high-temperature BEOL integration processing (up to 500° C.); ARC 16 must withstand the harsh processing conditions during BEOL integration. These include high temperature and intense UV cure. The process temperature can be as high as 450° C. The intensity of the light used in the UV cure process can be as high as tens of $J/cm^2$.

Characteristic (iii) ARC 16 prevents resist (e.g., patternable low-k material) poisoning by the substrate: The patternable low-k materials employed herein are preferably chemically amplified resists. They can be poisoned by any basic containment from the underlying substrate, such as a SiCN cap layer 14. ARC 16 must serve as a barrier layer to prevent basic contaminant from the underlying substrate from diffusing into the patternable low-k material to poison the chemically amplified patternable low-k material.

Characteristic (iv) ARC 16 provides vertical wall profile and sufficient etch selectivity between the patternable low-k material and the ARC layer: ARC 16 should provide sufficient reflectivity control with reflectivity from the underlying substrate under a particular lithographic wavelength of less than 8%, preferably less than 5%, more preferably less than 2% and generate vertical side wafer profile. ARC 16 should also generate residue-free patterns with no footing. Moreover, the adhesion of the patternable low-k material should be sufficient to prevent pattern collapse during patterning and the subsequent UV cure. ARC 16 should also be designed such that the etch selectivity during a subsequent ARC/cap open process is sufficiently high so that the opening of the ARC/cap stack does not erode a significant portion of the patternable low-k material and degrade significantly its pattern profile. An etch selectivity (etch rate ratio of ARC/cap versus patternable low-k material) is greater than 1, preferably greater than 3, more preferable greater than 5.

Characteristic (v) ARC 16 serves as a permanent dielectric layer in a chip: ARC 16 remains after patterning and cure of the patternable low-k material. It serves as a permanent dielectric layer in a chip. Therefore, ARC 16 (after cure) must meet the requirements of an on-chip dielectric insulator, including electrical properties (low dielectric constant: preferably k less than 5, and more preferably k less than 3.6; dielectric breakdown field: greater than 2 MV/cm, preferably greater than 4 MV/cm, and more preferably greater than 6 MV/cm, leakage: less than $10^{-5}$ A/cm$^2$, preferably less than $10^{-7}$ A/cm$^2$, and more preferably less than $10^{-9}$ A/cm$^2$); mechanical properties (adhesion energy is equal to or greater than the cohesive energy of the weakest layer of the integrated film stack); must pass electrical and mechanical reliability tests.

The thickness of the ARC 16 may vary depending on the technique used to form the same as well as the material make-up of the layer. Typically, the ARC 16 has a thickness from 5 nm to 200 nm, with a thickness from 20 nm to 140 nm being more typical. ARC 16 may be either organic, inorganic or a combination thereof.

Antireflective coatings are well known to those skilled in the art and include, for example, organic homopolymers or copolymers of polyesters, polyimides, polyacrylates, polymethacrylates, polysulfones, and amorphous carbon that satisfy all of the characteristics of ARC 16 mentioned above. The ARC 16 may be applied by spin-on techniques, spray on techniques, dipping, etc. Inorganic antireflective coatings, such as silicon oxynitride (SiON), silicon carbide (SiC), silicon oxycarbide (SiOC), SiCOH, siloxane, silane, carbosilane, oxycarbosilane, and silsesquioxane, either as a polymer or a copolymer may also be employed and may be deposited, for example, by plasma-enhanced chemical vapor deposition, spin-on techniques, dipping, etc. When ARC 16 is a multi-layer ARC, the deposition of each layer may be the same or a combination of deposition methods can be used. After applying ARC 16, particularly those from a liquid phase, a post deposition baking step is usually required to remove unwanted components, such as solvent, and to effect crosslinking. The post deposition baking step of ARC 16 is typically, but not necessarily always, performed at a temperature from 80° C. to 300° C., with a baking temperature from 120° C. to 200° C. being even more typical.

Examples of ARC materials that can be employed in the present invention as ARC 16 include, but are not limited to those disclosed within U.S. Ser. No. 11/858,636, filed Sep. 20, 2007, now U.S. Patent Application Publication No. 2009/0079076, and U.S. Ser. No. 11/858,615, filed Sep. 20, 2007, now U.S. Patent Application Publication No. 2009/0081418. The entire contents of each of the aforementioned ARC materials are incorporated herein by reference in their entirety.

In some embodiments, the as-deposited ARC 16 may be subjected to a post deposition treatment to improve the properties of the entire layer or the surface of ARC 16. This post deposition treatment can be selected from heat treatment, irradiation of electromagnetic wave (such as ultra-violet light), particle beam (such as an electron beam, or an ion beam), plasma treatment, chemical treatment through a gas phase or a liquid phase (such as application of a monolayer of surface modifier) or any combination thereof. This post-deposition treatment can be blanket or pattern-wise. The post deposition treatment enhances the chemical, physical, electrical, and/or mechanical properties of the ARC 16 and/or the film stack containing ARC 16, such as adhesion strength. The chemical properties include nature and/or location of surface functional groups, and hydrophilicity. The physical properties include density, moisture absorption, and heat conductivity. The mechanical properties include modulus, hardness, cohesive strength, toughness, resistance to crack and adhesion strength to its neighboring layers. The electrical properties include dielectric constant, electrical breakdown field, and leakage current.

The heat treatment should be no higher than the temperature that the underlying substrate can withstand, usually 500° C. This heat treatment can be conducted in an inert environment or within a chemical environment in a gas phase or a liquid phase. This treatment step may or may not be performed in the same tool as that used in forming ARC 16.

The post deposition treatment by irradiation of electromagnetic wave can be by ultra-violet (UV) light, microwave and the like. The UV light can be broadband with a wavelength range from 100 nm to 1000 nm. It can also be UV light generated by an excimer laser or other UV light source. The UV treatment dose can be a few mJ/cm$^2$ to thousands of J/cm$^2$. This irradiation treatment can be conducted at ambient temperature or at an elevated temperature no higher than 500° C. This irradiation treatment can be conducted in an inert environment or within a chemical environment in a gas phase or a liquid phase. In one embodiment, the following conditions may be employed: a radiation time from 10 see to 30 min, a temperature from room temperature to 500° C., and an environment including vacuum, or gases such as, for example, inert gas, $N_2$, $H_2$, $O_2$, $NH_3$, hydrocarbon, and $SiH_4$. This treatment step may or may not be performed in the same tool as that used in forming the ARC 16.

The post deposition treatment by plasma treatment can be selected from oxidizing plasma, reducing plasma or a neutral plasma. Oxidizing plasmas include, for example, $O_2$, CO, and $CO_2$. Reducing plasmas include, for example, $H_2$, $N_2$, $NH_3$, and $SiH_4$. The neutral plasmas include, for example, Ar and He. A plasma treatment time from 1 sec to 10 min and a plasma treatment temperature from room temperature to 400° C. can be employed. This treatment step may or may not be performed in the same tool as that used in forming the ARC 16.

The post deposition chemical treatment may be conducted in a gas phase or a liquid phase. In one embodiment, the following conditions may be employed: a treatment time from 1 sec to 30 min, a temperature from room temperature to 500° C. Chemicals suitable for this chemical treatment may be selected from any chemicals that improve chemical, physical, electrical, and/or mechanical properties of ARC 16 and/or the film stack containing ARC 16, such as adhesion strength. This chemical treatment may penetrate the entire layer of ARC 16 or is limited only to the surface of the ARC 16. Example chemicals include adhesion promoters such as, for example, silanes, siloxanes, and silylation agents. This treatment step may or may not be performed in the same tool as that used in forming the ARC 16.

Examples of such post deposition treatments are disclosed, for example, in U.S. Ser. No. 11/626,550, filed Jan. 24, 2007, now U.S. Patent Application Publication No. 2008/0173984, the entire content which is incorporated herein by reference.

Figure 2B:
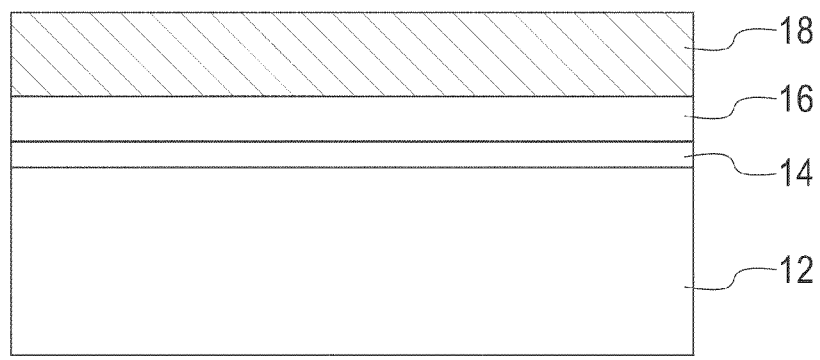

Next, and as illustrated in FIG. 2B, a first patternable low-k material 18, which combines the function of a photoresist and low-k material into one single material is provided. In the embodiment illustrated, the first patternable low-k material 18 is provided on the surface of the ARC 16. In other embodiments, the first patternable low-k material 18 can be provided directly on the dielectric cap 14 (when no ARC 16 is present) or directly on the surface of substrate 12 (when neither ARC 16 nor dielectric cap 14 is present).

The first patternable low-k material 18 is provided (i.e., formed) utilizing a conventional deposition process including, for example, spin-on-coating, dip coating, brush coating, and ink-jet dispensing. After applying the first patternable low-k material 18, a post deposition baking step is typically, but not necessarily always, required to remove unwanted components, such as solvent. When performed, the baking step is conducted at a temperature from 40° C. to 200° C., with a baking temperature from 60° C. to 140° C. being even more preferred. The duration of the baking step varies from 10 seconds to 600 seconds and is not critical herein.

The thickness of the first patternable low-k material 18 may vary depending on the requirement of the chip and the technique used to form the same as well as the material make-up of the layer. Typically, the first patternable low-k material 18 has a thickness from 1 nm to 50000 nm, with a thickness from 20 nm to 5000 nm being more typical.

As stated above, the first patternable low-k material 18 functions as a photoresist and is converted into a low-k material during post patterning processing, by heat, UV light, electron beam, ion beam, microwave, plasma cure, thermal cure or combinations thereof. For instance, the first patternable low-k material 18 may comprise a functionalized polymer, copolymer, or a blend including at least two of any combination of polymers and/or copolymers having one or more acid-sensitive imageable groups. These polymers, copolymers or blends can be converted into low-k polymers after subsequent processing. It is noted that when the patternable low-k material 18 is a polymer, it includes at least one monomer (to be described in greater detail below). When the patternable low-k material 18 is a copolymer, it includes at least two monomers (to be described in greater detail below). The blends of polymers and/or copolymers include at least two of any combination of polymers and/or copolymers described below.

In general terms, the patternable low-k material that can be employed as layer 18 comprises a polymer, a copolymer, or a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

More specifically, the first patternable low-k material 18 comprises a photo/acid-sensitive polymer of one monomer or a copolymer of at least two monomers selected from hydrocarbons, fluorinated hydrocarbons, siloxane, silane, carbosilane, oxycarbosilane, organosilicates, silsesquioxanes and the like. The first patternable low-k material 18 may also comprise a polymer of one monomer or a copolymer of at least two monomers selected from alkyltrialkoxysilane, tetra-alkoxysilane, unsaturated alkyl (such as vinyl) substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane. Additionally, the patternable low-k dielectric material 18 may comprise a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

Optionally the first patternable low-k material 18 may comprise at least one microscopic pore generator (porogen). The pore generator may be or may not be photo/acid sensitive. By "photo/acid sensitive": it means that this porogen is sensitive to light and/or acid such that the porogen itself is patternable or enhances the resolution and/or the pattern quality of the patternable low-k material. This pore generator has these attributes: (1) is compatible with the other components of the patternable low-k composition, i.e., without phase separation after coating and other processing; (2) can be patterned with standard lithographic techniques as part of the patternable low-k composition; and (3) can be removed during the post patterning cure process to generate microscopic pores, thus lowering the dielectric constant of the cured patternable low-k material. The pore size (diameter) should be less than 10 nm, preferably less than 5 nm, and more preferably less than 2 nm.

Illustrative polymers for the patternable low-k material 18 include, but are not limited to, siloxane, silane, carbosilane, oxycarbosilane, silsesquioxanes-type polymers including caged, linear, branched or combinations thereof. In one embodiment, the first patternable dielectric material 18 comprises a blend of these photo/acid-sensitive polymers. Examples of patternable low-k materials useable with the present disclosure are disclosed in U.S. Pat. Nos. 7,041,748, 7,056,840, and 6,087,064, as well as U.S. Ser. Nos. 11/750, 356, filed May 18, 2007, now U.S. Patent Application Publication No. 2008/0286467, 12/047,435, filed Mar. 13, 2008, and 12/126,287, filed May 23, 2008 all of which are incorporated herein by reference in their entirety. The dielectric constant of the patternable low-k material 18 after cure is generally no more than 4.3. The dielectric constant may be greater than 1 and up to 4.3, more preferably from 1 to 3.6, even more preferably from 1 to 3.0, further more preferably from 1 to 2.5, with from 1 to 2.0 being most preferred.

The first patternable low-k material 18 is formed from a composition that includes one of the above mentioned polymers, copolymers or blends, a photoacid generator, a base additive and a solvent typically used in a photoresists. When the first patternable low-k material 18 is a negative-tone patternable low-k material, it may be formed from a composition optionally including an additional cross-linker. This additional cross-linker can be a small compound (as compared with a polymer or copolymer) or a polymer, a copolymer, or a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

When the first patternable low-k material 18 is a positive-tone patternable low-k material, it is formed from a composition that includes one of the above mentioned polymers, copolymers or blends, a photoacid generator, a base additive and a solvent typically used in a photoresists. The photoacid generators, base additives and solvents are well known to those skilled in the art and, as such, details regarding those components are not fully provided.

In a preferred embodiment, the first patternable low-k material 18 is a chemically amplified positive-tone or negative-tone patternable low-k material that comprises a silsesquioxane polymer or copolymer or a blend of at least two of any combination of polymers and/or copolymers. This photo/acid sensitive silsesquioxane polymer or copolymer may undergo a photo/acid catalyzed chemical transformation to form circuit patterns after lithographic patterning. When the first patternable low-k material 18 is a chemically amplified positive-tone patternable low-k material, it typically undergoes a de-protection reaction to render the exposed area soluble in a developer; when the first patternable low-k material 18 is a chemically amplified negative-tone patternable low-k material, it typically undergoes a cross-linking reaction (to itself or through an additional cross-linker) to render it insoluble in a developer in the exposed regions during lithographic processing. Therefore, integrated circuit patterns can be generated during standard semiconductor lithography process. Furthermore, these integrated circuit patterns maintain their pattern integrity during the post patterning cure process to convert the patternable low-k material from a resist into a low-k material. Examples of such photo/acid sensitive silsesquioxane polymers or copolymers include poly(methylsilsesquioxane) (PMS), polyp-hydroxybenzylsilsesquioxane) (PHBS), poly(p-hydroxyphenylethylsilsesquioxane) (PHPES), poly(p-hydroxyphenylethylsilsesquioxane-co-p-hydroxy-alpha-methylbenzyl silsesquioxane) (PHPE/HMBS), poly(p-hydroxyphenylethylsilsesquioxane-co-methoxybenzylsilsesquioxane) (PHPE/MBS), poly(p-hydroxyphenylethylsilsesquioxane-co-t-butylsilsesquioxane) (PHPE/BS), poly(p-hydroxyphenylethylsilsesquioxane-co-cyclohexylsilsesquioxane) (PHPE/CHS), poly(p-hydroxyphenylethylsilsesquioxane-co-phenylsilsesquioxane) (PHPE/PS), poly(p-hydroxyphenylethylsilsesquioxane-co-bicycloheptylsilsesquioxane) (PHPE/BHS), polyp-hydroxy-alpha-methylbenzylsilsesquioxane) (PHMBS), polyp-hydroxy-alpha-methylbenzylsilsesquioxane-co-p-hydroxybenzylsilsesquioxane) (PHMB/HBS), poly(p-hydroxy-alpha-methylbenzylsilsesquioxane-co-methoxybenzylsilsesquioxane) (PHMB/MBS), poly(p-hydroxy-alpha-methylbenzylsilsesquioxane-co-t-butylsilsesquioxane) (PHMB/BS), poly(p-hydroxy-alpha-methylbenzylsilsesquioxane-co-cyclohexylsilsesquioxane) (PHMB/CHS), poly(p-hydroxy-alpha-methylbenzylsilsesquioxane-co-phenylsilsesquioxane) (PHMB/PS), polyp-hydroxy-alpha-methylbenzylsilsesquioxane-co-bicycloheptylsilsesquioxane) (PHMB/BHS), poly(p-hydroxybenzylsilsesquioxane-co-p-hydroxyphenylethylsilsesquioxane) (PHB/HPES), and poly(p-hydroxy-alpha-methylbenzylsilsesquioxane-co-p-alpha-methylbenzylsilsesquioxane) (PHMB/MBS). In one embodiment, the patternable low-k dielectric material 18 is a copolymer of at least two monomers selected from an alkyltrialkoxysilane and/or a tetra-alkoxysilane. Preferred copolymers are derived from at least two monomers selected from methyltrimethoxysilane, methyltriethoxysilane, ethyltrimethoxysilane, or ethyltriethoxysilane, as the alkyltrialkoxysilane monomer and tetra-methoxysilane or tetra-ethoxysilane, as the tetra-alkoxysilane monomer.

In another embodiment, the first patternable low-k dielectric material 18 comprises a polymer of one monomer or a copolymer of at least two monomers selected from alkyltrialkoxysilane, tetra-alkoxysilane, unsaturated alkyl (such as vinyl) substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

In one embodiment, the first patternable low-k material 18 comprises a silsesquioxane polymer. It may be linear, branched, caged compound or combinations thereof having the following general structural formula:

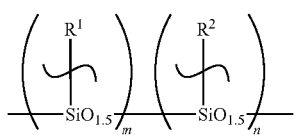

where, m and n represent the number of repeating units, $R^1$ represents a group which may comprise one or more functional groups which may provide polymer solubility in an aqueous base and provide functional groups for cross-linking, and $R^2$ represents a group which may comprise a carbon functionality which may control polymer dissolution rate in an aqueous base. Subscripts m and n may be integers in the range from 0 to 5000, such as 1 to 5000 for example. $R^1$ may not be the same as $R^2$.

$R^1$ is not limited to any specific functional group, and may comprise functional groups which are substituted with —OH groups, —C(O)OH groups, —F, or combinations thereof. $R^1$ may comprise linear or branched alkyls, cycloalkyls, aromatics, arenes, or acrylics. For example, $R^1$ may be:

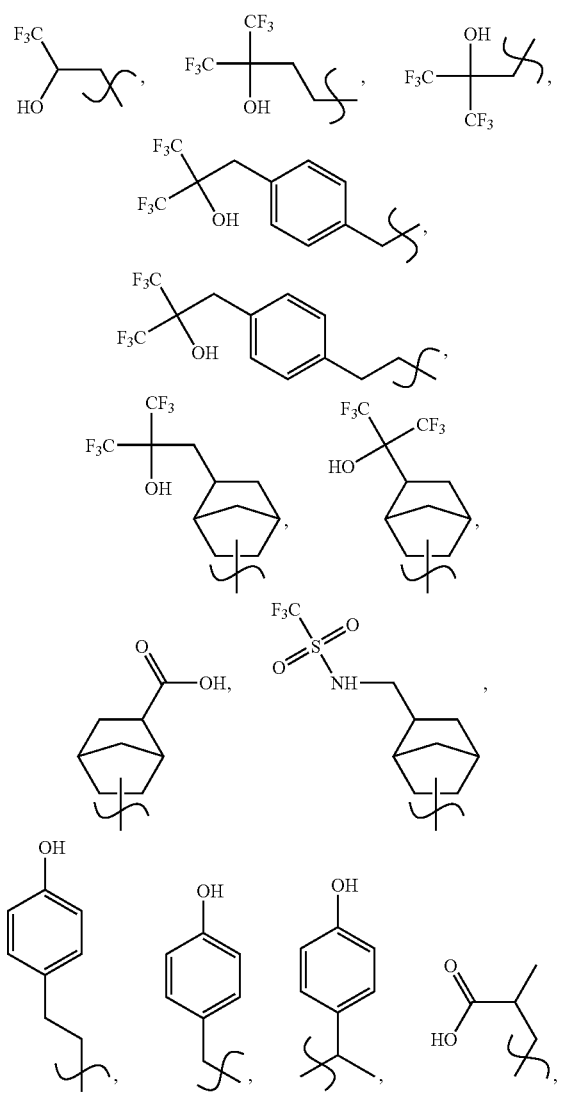

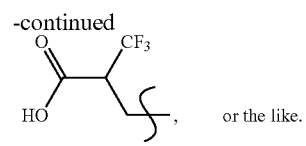

$R^2$ is not necessarily limited to any specific functional group, and may comprise hydrogen, or linear or branched alkyls, cycloalkyls, aromatics, arenes, acrylates, or combinations thereof. For example $R^2$ may be:

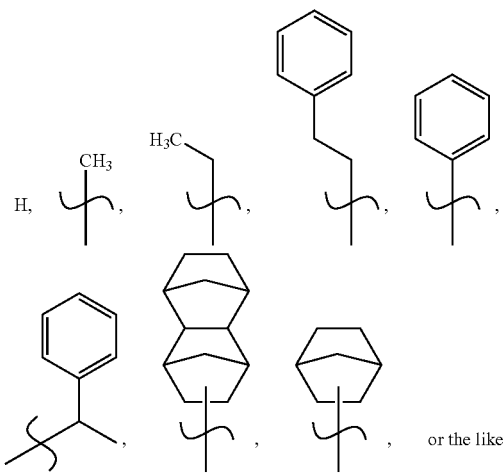

The $R^1$ and $R^2$ proportions and structures may be selected to provide a material suitable for photolithographic patterning processes.

In one embodiment, the first patternable low-k dielectric material 18 is a negative-tone patternable low-k dielectric material comprising a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane. The polymers in the blend may be miscible with each other. The first polymer or copolymer of the polymer blend has been described above.

In some instances, the second polymer of the polymer blend of this embodiment may comprise a polymer of one monomer or a copolymer including at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane. In one embodiment, the second polymer of the polymer blend may comprise a copolymer at least two monomers selected from siloxane, silane, silsesquioxane, carbosilane, or oxycarbosilane moieties. In another embodiment of the present invention, the second polymer of the polymer blend may comprise a copolymer of at least two monomers selected from an alkyltrialkoxysilane and/or a tetra-alkoxysilane. The molar ratio of the alkyltrialkoxysilane monomer in the copolymer ranges from 0 to 100%. The weight average molecular weight of the copolymer range from 100-5,000,000 g/mol, preferably 500-50,000 g/mol. Preferred copolymers are derived from at least two monomers selected from methyltrimethoxysilane, methyltriethoxysilane, ethyltrimethoxysilane, or ethyltriethoxysilane, as the alkyltrialkoxysilane monomer and tetra-methoxysilane or tetra-ethoxysilane, as the tetra-alkoxysilane monomer. In one embodiment, the second polymer of the polymer blend is a copolymer of methylsilsesquioxane and tetra-alkoxysilane.

In another embodiment, the second polymer of the polymer blend is a silsesquioxane polymer comprising a polymer having the structural formula:

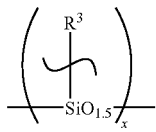

wherein $R^3$ may be a functional group comprising alkyls, cycloalkyls, aryl, or combinations thereof, and wherein x represents the number of repeating units and may be an integer in a range from 4 to 50000. For example, $R^3$ may be:

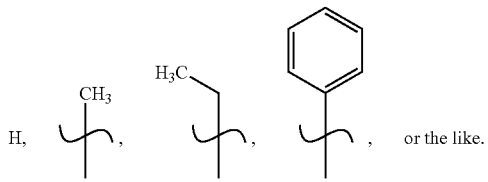

In one embodiment, the polysilsesquioxane may be poly (methylsilsesquioxane), where $R^3$ is a methyl group, and x is an integer from 10 to 1,000. In other embodiments, x may be greater than 1,000. The polysilsesquioxane may also comprise a copolymer with siloxane, silane, carbosilane, oxycarbosilane, alkyltrialkoxysilane, or tetra-alkoxysilane. The polysilsesquioxane structure may be caged, linear, branched, or a combination thereof. The silsesquioxane polymers described herein may comprise end groups comprising silanols, halosilanes, acetoxysilanes, silylamines, alkoxysilanes, or combinations thereof, which may undergo condensation reactions in the presence of an acid (such as an acid generated by a photoacid generator under exposure to radiation), followed by thermal baking. Polymer molecules of the polysilsesquioxane may undergo chemical crosslinking with the first polymer or copolymer of the polymer blend, the second polysilsesquioxane polymer or copolymer in the polymer blend itself, or a combination of these.

In one embodiment, the polysilsesquioxane may be the silsesquioxane copolymer LKD-2056 or LKD2064 (products of JSR Corporation) which contains silanol end groups. Such crosslinking may be not limited to silanols, but may also include halosilanes, acetoxysilanes, silylamines, and alkoxysilanes. The silsesquioxane polymers described herein may undergo chemical crosslinking, including photoacid-catalyzed crosslinking, thermally induced crosslinking, or a combination of these, such as condensation reactions of silanol end groups, for example.

The second silsesquioxane polymers or copolymers in the polymer blend may have a weight averaged molecular weight in the range from 200 to 5,000,000 g/mol, such as from 1500 to 10,000 g/mol, for example.

In another embodiment, the first patternable low-k dielectric material 18 is a negative-tone patternable low-k material comprising a carbosilane-substituted silsesquioxane polymer that may be a linear, branched, caged compound or a combination thereof, having the following general structural formula:

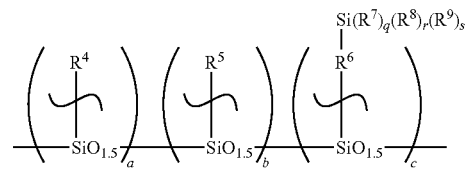

where, a, b, and c represent the number of each of the repeating units, $R^4$, $R^5$, $R^6$, $R^7$, and $R^8$ are carbon-containing groups, and $R^9$ is an alkoxy group. $R^6$, $R^7$ and $R^8$ may each independently represent a hydrocarbon group comprising 1 to 6 carbon atoms.

$R^4$, $R^5$, $R^6$, $R^7$, $R^8$, $R^9$ may be non-identical groups. Subscripts a, b, and c represent the number of repeating units in the polymer chain. Subscripts q and r may be integers in a range from 0 to 3. Subscript s may be an integer in a range from 1 to 3. Subscripts a and c may be integers greater than zero. For example a and c may each independently be in a range from 1 to 5,000. Subscript b may be an integer greater than or equal to zero. For example, b may be an integer in a range from 0 to 5,000.

$R^4$ may represent a group which comprises one or more functional groups which provide polymer solubility in an aqueous base and functional groups for a cross-linking reaction. Each instance of $R^4$ is not limited to any specific functional group, and may comprise a functional group which is substituted with one or more —OH groups, —C(O)OH groups, —F, or combinations thereof. $R^4$ may comprise linear or branched alkyls, cycloalkyls, aromatics, arenes, or acrylics. Examples of $R^4$ include:

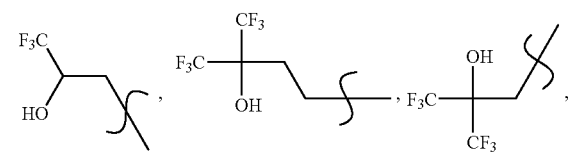

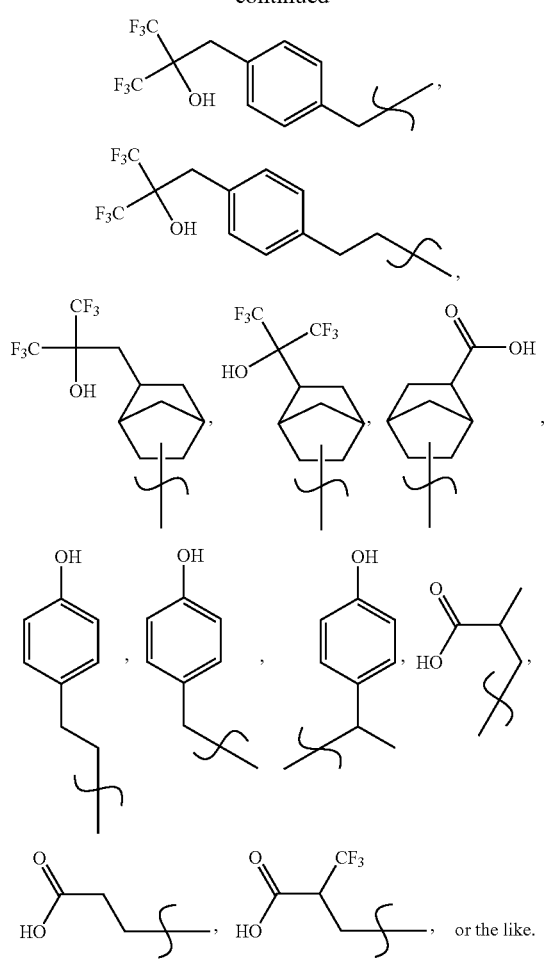

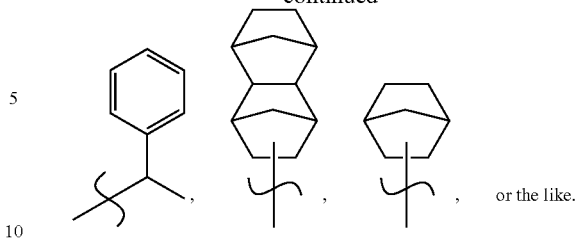

$R^5$ may represent a group which comprises a carbon functionality comprising at least one carbon atom, where the carbon functionality controls polymer dissolution of the polymer into an aqueous base. The structure (e.g., size, chain length, etc.) of $R^5$ may affect the dissolution rate of the polymer into an aqueous base. Balancing of the dissolution-controlling group, $R^5$, with the solubility and cross-linking controlling group, $R^4$, allows properties such as dissolution rate and aqueous base solubility to be appropriately adjusted. $R^5$ is not necessarily limited to any specific functional group, and may comprise linear or branched alkyls, cycloalkyls, aromatics, arenes, acrylates, or combinations thereof Examples of $R^5$ include:

$R^6$ is not limited to any specific alkoxy group. Examples of $R^6$ include linear or branched alkoxys, cycloalkoxy, and acetoxy groups.

The specific proportions and structures of $R^4$, $R^5$, and $R^6$ may be selected to provide a material suitable for photolithographic patterning processes.

In another embodiment the first patternable low-k material 18 is a negative-tone patternable low-k material comprising a polymer blend of a first polymer or copolymer and a second polymer or copolymer wherein the first polymer is the carbosilane-substituted silsesquioxane polymer described above and the second polymer is polymer of one monomer or a copolymer of at least two monomers selected from siloxane, silane, silsesquioxane, carbosilane, or oxycarbosilane moieties. In one embodiment of the present invention, the second polymer of the polymer blend may comprise a copolymer of at least two monomers selected from an alkyltrialkoxysilane and/or a tetra-alkoxysilane. The molar ratio of the alkyltrialkoxysilane monomer in the copolymer ranges from 0 to 100%. The weight average molecular weight of the copolymer range from 100-5,000,000 g/mol, preferably 500-50,000 g/mol. Preferred copolymers are derived from at least two monomers selected from methyltrimethoxysilane, methyltriethoxysilane, ethyltrimethoxysilane, or ethyltriethoxysilane, as the alkyltrialkoxysilane monomer and tetra-methoxysilane or tetra-ethoxysilane, as the tetra-alkoxysilane monomer. In one embodiment, the second polymer of the polymer blend is a copolymer of methylsilsesquioxane and tetra-alkoxysilane.

In another embodiment, the negative-tone carbosilane-substituted silsesquioxane patternable low-k composition may be a polymer blend of a first polymer and a second polymer wherein the first polymer is the carbosilane-substituted silsesquioxane polymer described above and the second polymer of the polymer blend is a silsesquioxane polymer comprising a polymer having the structural formula:

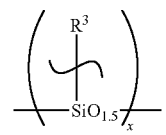

wherein $R^3$ may be a functional group comprising alkyls, cycloalkyls, aryl, or combinations thereof, and wherein x represents the number of repeating units and may be an integer in a range from 4 to 50000. For example, $R^3$ may be:

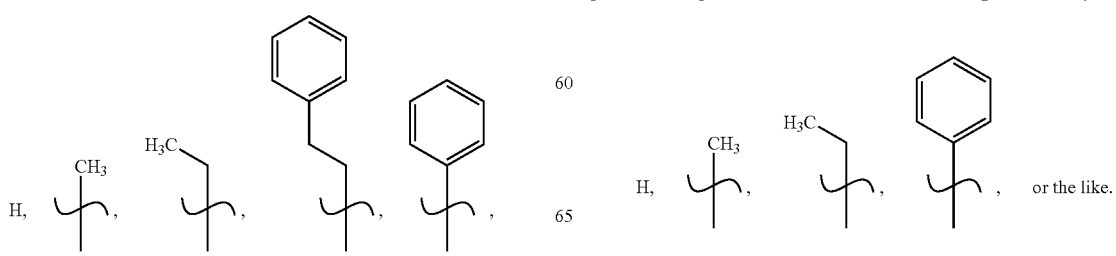

In one embodiment, the polysilsesquioxane may be poly (methylsilsesquioxane), where $R^3$ is a methyl group, and x is an integer from 10 to 1,000. In other embodiments, x may be greater than 1,000. The polysilsesquioxane may also comprise a copolymer with siloxane, silane, carbosilane, oxycarbosilane, alkyltrialkoxysilane, or tetra-alkoxysilane. The polysilsesquioxane structure may be caged, linear, branched, or a combination thereof. The silsesquioxane polymers or copolymers described herein may comprise end groups comprising silanols, halosilanes, acetoxysilanes, silylamines, alkoxysilanes, or combinations thereof; which may undergo condensation reactions in the presence of an acid (such as an acid generated by a photoacid generator under exposure to radiation), followed by thermal baking. Polymer molecules of the polysilsesquioxane may undergo chemical crosslinking with the first polymer or copolymer of the polymer blend, the second polysilsesquioxane polymer or copolymer in the polymer blend itself, or a combination of these. In one embodiment, the polysilsesquioxane may be the silsesquioxane copolymer LKD-2056 or LKD2064 (products of JSR Corporation) which contains silanol end groups. Such crosslinking may be not limited to silanols, but may also include halosilanes, acetoxysilanes, silylamines, and alkoxysilanes. The silsesquioxane polymers described herein may undergo chemical crosslinking, including photoacid-catalyzed crosslinking, thermally induced crosslinking, or a combination of these, such as condensation reactions of silanol end groups, for example.

The silsesquioxane polymers representing the second polymer of the polymer blend described for this embodiment may have a weight averaged molecular weight in the range from 200 grams/mole (g/mol) to 500,000 g/mol, such as from 1500 g/mol to 10,000 g/mol, for example.

In another embodiment, compositions containing a blend of at least two of any combination of a silsesquioxane polymer and/or a silsesquioxane copolymer are employed. The silsesquioxane polymer or copolymer in the blend may be selected from the silsesquioxane polymers or copolymers described above or may be selected from other silsesquioxane polymers or copolymers such as, for example, poly(methylsilsesquioxane) (PMS), poly(p-hydroxybenzylsilsesquioxane) (PHBS), poly(p-hydroxybenzylsilsesquioxane-co-methoxybenzylsilsesquioxane) (PHB/MBS), polyp-hydroxy-alpha-methylbenzylsilsesquioxane-co-p-alpha-methylbenzylsilsesquioxane) (PHMB/MBS), poly(p-hydroxybenzylsilsesquioxane-co-t-butylsilsesquioxane) (PHB/BS), poly(p-hydroxybenzylsilsesquioxane-co-cyclohexylsilsesquioxane) (PHB/CHS), poly(p-hydroxybenzyl-silsesquioxane-co-phenylsilsesquioxane) (PHB/PS), poly(p-hydroxybenzylsilsesquioxane-co-bicycloheptylsilsesquioxane) (PHB/BHS), and caged silsesquioxanes such as octakis(glycidyloxypropyl)dimethylsilyloxy)silsesquioxane, octakis[cyclohexenyl epoxide) dimethylsilyloxy]silsesquioxane, octakis[4-(hydroxyphenylethyl)dimethylsilyloxy]silsesquioxane, and octakis[{2-(1',1'-bis(trifluoromethyl)-1'-hydroxyethyl)norbornyl}dimethylsilyloxy]silsesquioxane. If desired, a combination of different Si-containing polymers may be used in the blend with the non-Si-containing polymers, such as a pore generator.

In yet another embodiment, the first patternable low-k dielectric material 18 comprises a copolymer of at least two monomers selected from an alkyltrialkoxysilane and/or a tetra-alkoxysilane. Preferred copolymers are derived from at least two monomers selected from methyltrimethoxysilane, methyltriethoxysilane, ethyltrimethoxysilane, or ethyltriethoxysilane, as the alkyltrialkoxysilane monomer and tetramethoxysilane or tetra-ethoxysilane, as the tetra-alkoxysilane monomer.

In a preferred embodiment for negative-tone patternable low-k materials two miscible, or compatible, silsesquioxanes are employed. The first silsesquioxane polymer or copolymer is a linear, branched, caged compound or combination thereof having the following structural formula:

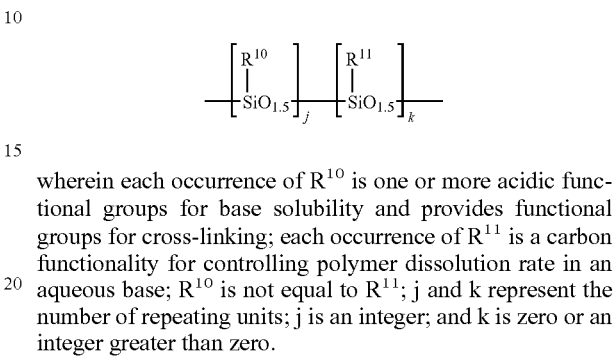

wherein each occurrence of $R^{10}$ is one or more acidic functional groups for base solubility and provides functional groups for cross-linking; each occurrence of $R^{11}$ is a carbon functionality for controlling polymer dissolution rate in an aqueous base; $R^{10}$ is not equal to $R^{11}$; j and k represent the number of repeating units; j is an integer; and k is zero or an integer greater than zero.

In the present invention, $R^{10}$ is not limited to any specific functional group, and is preferably selected from among linear or branched alkyls which are substituted with OH, C(O)OH, and/or F; cycloalkyls which are substituted with OH, C(O)OH, and/or F; aromatics which are substituted with OH, C(O)OH, and/or F; arenes that are substituted with OH, C(O)OH, and/or F; and acrylics which are substituted with OH, C(O)OH, and/or F. Examples of preferred $R^{10}$ include:

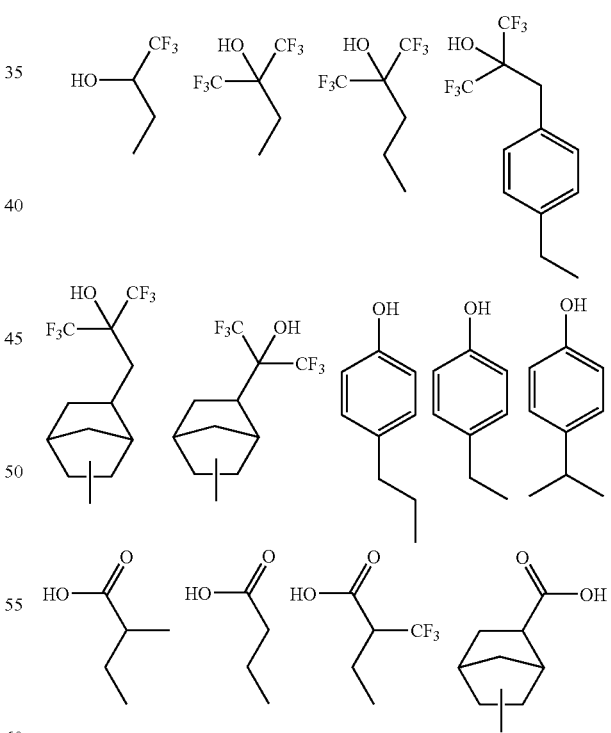

In the present invention, $R^{11}$ is not limited to any specific carbon functional group, and is preferably selected from among linear or branched alkyls, cycloalkyls, aromatics, arenes, and acrylates.

The silsesquioxane polymers or copolymers of this embodiment have a weight averaged molecular weight of 400 to 500,000, and more preferable from 1500 to 10,000. The $R^{10}$ and $R^{11}$ proportions and structures are selected to provide a material suitable for photolithographic processes.

A second polymer component of the blend material includes but is not limited to a family of organosilicates known as silsesquioxanes having the structural formula:

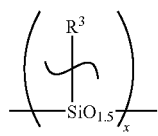

wherein $R^3$ may be a functional group comprising alkyls, cycloalkyls, aryl, or combinations thereof and wherein x represents the number of repeating units and may be an integer in a range from 4 to 50000. For example, $R^3$ may be:

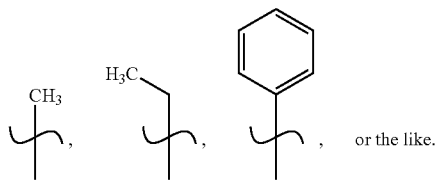

, or the like.

In one embodiment, the polysilsesquioxane may be poly(methylsilsesquioxane), where $R^3$ is a methyl group, and x is an integer from 10 to 1,000. In other embodiments, x may be greater than 1,000. The polysilsesquioxane may also comprise a copolymer with siloxane, silane, carbosilane, oxycarbosilane, alkyltrialkoxysilane, or tetra-alkoxysilane. The polysilsesquioxane structure may be caged, linear, branched, or a combination thereof. The silsesquioxane polymers or copolymers described herein may comprise end groups comprising silanols, halosilanes, acetoxysilanes, silylamines, alkoxysilanes, or combinations thereof, which may undergo condensation reactions in the presence of an acid (such as an acid generated by a photoacid generator under exposure to radiation), followed by thermal baking. Polymer molecules of the polysilsesquioxane may undergo chemical crosslinking with the first polymer or copolymer of the polymer blend, the second polysilsesquioxane polymer or copolymer in the polymer blend itself, or a combination of these. In one embodiment, the polysilsesquioxane may be the silsesquioxane copolymer LKD-2056 or LKD2064 (products of JSR Corporation) which contains silanol end groups. Such crosslinking may be not limited to silanols, but may also include halosilanes, acetoxysilanes, silylamines, and alkoxysilanes. The silsesquioxane polymers described herein may undergo chemical crosslinking, including photoacid-catalyzed crosslinking, thermally induced crosslinking, or a combination of these, such as condensation reactions of silanol end groups, for example.

A third component of a negative-tone patternable low-k composition is a photosensitive acid generator (PAG). Examples of preferred PAGs include: -(trifluoro-methylsulfonyloxy)-bicyclo[2.2.1]hept-5-ene-2,3-dicarboximide (MDT), onium salts, aromatic diazonium salts, sulfonium salts, diaryliodonium salts, and sulfonic acid esters of N-hydroxyamides or -imides, as disclosed in U.S. Pat. No. 4,371,605. The content of the '605 patent is incorporated herein by reference. A weaker acid generated from a PAG such as N-hydroxy-naphthalimide (DDSN) may be used. Combinations of PAGs may be used.

The composition of the silsesquioxane polymers or copolymers in the blend formulation is 1 to 99% of the total polymer composition. In a preferred embodiment, the composition of the acid sensitive polymer is 20 to 80% of the total polymer composition, and even more preferred, 30 to 60%.

Condensation in the presence of an acid generated by a photoacid generator under exposure to radiation is not limited to silanols, but may also include halosilanes, acetoxysilanes, silylamines, and alkoxysilanes. Organic crosslinking agents, such as methylphenyltetramethoxymethyl glycouril (methylphenyl powderlink), may also be included in the formulation. Although photoacid generators are preferred for crosslinking, photobase generators can also be used for crosslinking silanol polymers or copolymers.

The first patternable low-k material 18 also typically includes a casting solvent to dissolve the other components. Examples of suitable casting solvent include but are not limited to ethoxyethylpropionate (EEP), a combination of EEP and γ-butyrolactone, propylene-glycol monomethylether alcohol and acetate, propyleneglycol monopropyl alcohol and acetate, and ethyl lactate. Combinations of these solvents may also be used.

In optimizing the photolithography process, an organic base may be added to the formulation. The base employed in the present invention may be any suitable base known in the resist art. Examples of bases include tetraalkylammonium hydroxides, cetyltrimethylammonium hydroxide, and 1,8-diaminonaphthalene. The compositions are not limited to any specific selection of base.

In yet another embodiment, the first patternable low-k material 18 is a chemically amplified positive-tone patternable low-k material comprising a silicon-containing polymer. The silicon-containing polymer employed may be a homopolymer or a copolymer. Suitable types of such silicon-containing polymers include a polymer, a copolymer, a blend including at least two of any combination of polymers and/or copolymers, wherein said polymers include one monomer and said copolymers include at least two monomers and wherein said monomers of said polymers and said monomers of said copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane. Highly preferred silicon-backbone polymers are selected from the group consisting of poly(hydroxyphenyl alkyl)silsesquioxanes and poly (hydroxyphenyl alkyl) siloxanes, wherein the alkyl is a $C_{1-30}$ moiety. These preferred silicon-containing polymers are preferably fully or partially protected with acid-sensitive protecting groups.

Where the silicon-containing polymeric additive contains a silicon-containing substituent bonded to the polymeric backbone, the silicon-containing polymeric additive may be a homopolymer or copolymer containing at least one monomer having a silicon-containing substituent. The silicon-containing substituent may or may not be acid sensitive. Typically, however the substituent is acid sensitive when containing a $C_2$ alkyl moiety. Preferably, the silicon-containing substituent is attached to a monomer selected from the group consisting of hydroxystyrene, an acrylate, a methacrylate, an acrylamide, a methacrylamide, itaconate, an itaconic half ester or a cycloolefin. Preferred silicon-containing substituents include: siloxane, silane and cubic silsesquioxanes. The silicon-containing polymer may further include silicon-free monomers such as those selected from the group consisting of styrene, hydroxystyrene, acrylic acid, methacrylic acid, itaconic acid and an anhydride such as maleic anhydride and itaconic anhydride.

Preferred monomers containing silicon-containing substituents are trimethylsilyl alkyl acrylate, trimethylsilyl alkyl methacrylate, trimethylsilyl alkyl itaconate, tris(trimethylsilyl)silyl alkyl acrylate tris(trimethylsilyl)silyl alkyl methacrylate, tris(trimethylsilyl)silyl alkyl itaconate, tris(trimethylsilyloxy)silyl alkyl acrylate, tris(trimethylsilyloxy)silyl alkyl methacrylate, tris(trimethylsilyloxy)silyl alkyl itaconate, alkylsilyl styrene, trimethylsilylethyl(dimethoxy)silyloxy alkyl acrylate, trimethylsilylmethyl(dimethoxy)silyloxy alkyl methacrylate, trimethylsilylmethyl(dimethoxy)silyloxy alkyl itaconate, trimethylsilyl alkyl norbornene-5-carboxylate alkyl, tris(trimethylsilyl)silyl alkyl norbornene-5-carboxylate and tris(trimethylsilyloxy)silyl alkyl norbornene-5-carboxylate, wherein alkyl is a $C_{1-5}$ moiety.

Highly preferred species of these monomers are 3-(3,5,7,9,11,13,15-heptacyclopentylpentacyclo[9.5.1.13,9.15,15.17,13]-octasiloxan-1-yl)propyl methacrylate, 1,3,5,7,9,11,13-heptacyclopentyl-15-vinylpentacyclo[9.5.1.13,9.15,15.17,13]octasiloxane, methacrylamidotrimethylsilane, O-(methacryloxyethyl)-N-(triethoxysilylpropyl)urethane, methacryloxyethoxytrimethylsilane, N-(3-methacryloxy-2-hydroxypropyl)-3-aminopropyltriethoxysilane, (methacryloxymethyl)bis(trimethylsiloxy)methylsilane, (m,p-vinylbenzyloxy)trimethylsilane, methacryloxypropyltris(trimethylsiloxy)silane, methacryloxytrimethylsilane, 3-methacryloxypropybis(trimethylsiloxy)methylsilane, 3-methacryloxypropyldimethylchlorosilane, methacryloxypropyldimethylethoxysilane, methacryloxypropyldimethylmethoxysilane, methacryloxypropylheptacyclopentyl-T8-silsesquioxane, methacryloxypropylmethyldichlorosilane, methacryloxypropylmethyldiethoxysilane, methacryloxypropylmethyldimethoxysilane, (methacryloxymethyl)dimethylethoxysilane, (methacryloxymethyl)phenyldimethylsilane(phenyldimethylsilyl)methylmethacrylate, methacryloxymethyltriethoxysilane, methacryloxymethyltrimethoxysilane, methacryloxymethyltris(trimethylsiloxy)silane, O-methacryloxy(polyethyleneoxy)trimethylsilane, methacryloxypropylpentamethyldisiloxane, methacryloxypropylsilatrane, methacryloxypropylsiloxane macromer, methacryloxypropyl terminated polydimethylsiloxane, methacryloxypropyltrichlorosilane, methacryloxypropyltriethoxysilane, methacryloxypropyltrimethoxysilane, methacryloxypropyltris(methoxyethoxy)silane, p-(t-butyldimethylsiloxy)styrene, butenyltriethoxysilane, 3-butenyltrimethylsilane, (3-acryloxypropyl)trimethoxysilane, (3-acryloxypropyl)tris(trimethylsiloxy)silane, O-(trimethylsilyl)acrylate, 2-trimethylsiloxyethlacrylate, N-(3-acryloxy-2-hydroxypropyl)-3-aminopropyltriethoxysilane, (3-acryloxypropyl)dimethylmethoxysilane, (3-acryloxypropyl)methylbis(trimethylsiloxy)silane, (3-acryloxypropyl)methyldichlorosilane, and (3-acryloxypropyl)methyldimethoxysilane, (3-acryloxypropyl)trichlorosilane.

The extent of protection and the amount of co-monomer present in the silicon containing polymeric additive are such that the patternable low-k material resist composition will provide good lithography performance, i.e., high resolution and good process window. It should also maintain pattern integrity after post cure processing patterning. Examples of protecting groups which can be employed are cyclic and branched (secondary and tertiary) aliphatic carbonyls, esters or ethers containing from 3 to 30 carbon atoms, acetals, ketals and aliphatic silylethers.

Examples of cyclic or branched aliphatic carbonyls that may be employed in the present invention include, but are not limited to: phenolic carbonates; t-alkoxycarbonyloxys such as t-butoxylcarbonyloxy and isopropyloxycarbonyloxy. A highly preferred carbonate is t-butoxylcarbonyloxy.

Some examples of cyclic and branched ethers that may be employed in the present invention include, but are not limited to benzyl ether and t-alkyl ethers such t-butyl ether. Of the aforesaid ethers, it is highly preferred to use t-butyl ether.

Examples of cyclic and branched esters that can be employed are carboxylic esters having a cyclic or branched aliphatic substituent such as t-butyl ester, isobornyl ester, 2-methyl-2-admantyl ester, benzyl ester, 3-oxocyclohexanyl ester, dimethylpropylmethyl ester, mevalonic lactonyl ester, 3-hydroxy-g-butyrolactonyl ester, 3-methyl-g-butylrolactonyl ester, bis(trimethylsilyl)isopropyl ester, trimethylsilylethyl ester, tris(trimethylsilyl)silylethyl ester and cumyl ester.

Some examples of acetals and ketals that can be employed include, but are not limited to phenolic acetals and ketals as well as tetrahydrofuranyl, tetrahydropyranyl, 2-ethoxyethyl, methoxycyclohexanyl, methoxycyclopentanyl, cyclohexanyloxyethyl, ethoxycyclopentanyl, ethoxycyclohexanyl, methoxycycloheptanyl and ethoxycycloheptanyl. Of these, it is preferred that a methoxycyclohexanyl ketal be employed.

Illustrative examples of silylethers that can be employed include, but are not limited to: trimethylsilylether, dimethylethylsilylether and dimethylpropylsilylether. Of these silylethers, it is preferred that trimethylsilylether be employed.

In one embodiment, the first patternable low-k dielectric material 18 is a positive-tone patternable low-k material comprising a polymer blend of at least two silsesquioxane polymers or copolymers. The polymers or copolymers in the blend may be miscible with each other. The first silsesquioxane polymer or copolymer may be linear, branched, caged compound or combinations thereof having the following general structural formula:

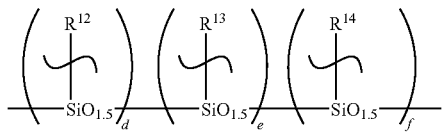

where, d, e and f represent the number of each of the repeating units, $R^{12}$ represents a carbon functionality (the carbon functionality comprising at least one carbon atom) having an acid-labile protecting group, $R^{13}$ represents a group which may comprise one or more functional groups which provide polymer solubility in aqueous base, and $R^{14}$ represents a group which may comprise a carbon functionality comprising at least one carbon atom, where the carbon functionality controls polymer dissolution rate of the polymer blend into aqueous base. $R^{12}$, $R^{13}$, and $R^{14}$ may be non-identical groups. Subscripts d, e, and f represent the number of repeating units. Subscripts d and f may be integers greater than zero. For example d and f may each independently be in a range from 1 to 5,000. Subscript e may be an integer greater than or equal to zero. For example, e may be an integer in a range from 0 to 5,000.

$R^{12}$ is not limited to any specific carbon functional group, and may be selected from among conventional acid sensitive protecting groups, such as carbonates, tertiary esters, acetals, ketals, the like, and combinations thereof. For example, the acid sensitive protecting group may comprise a tert-butylacetate group, where $R^{12}$ may be:

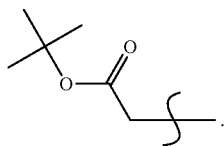

$R^{13}$ is not limited to any specific functional group, and may comprise functional groups which are substituted with —OH groups, —C(O)OH groups, —F, or combinations thereof $R^{13}$ may comprise linear or branched alkyls, cycloalkyls, aromatics, arenes, or acrylics. For example, $R^{13}$ may be

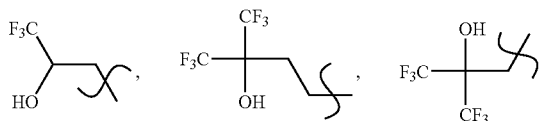

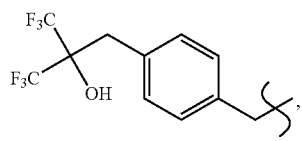

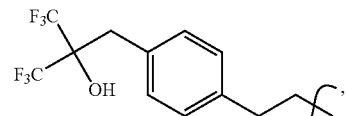

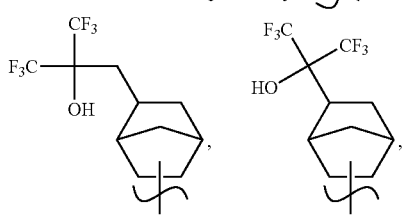

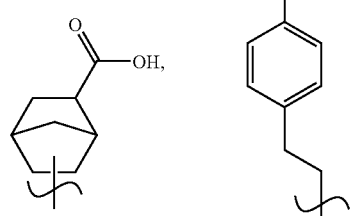

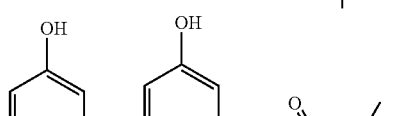

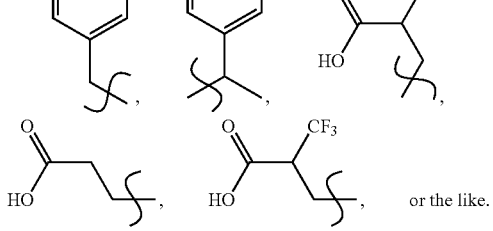

or the like.

$R^{14}$ is not necessarily limited to any specific functional group, and may comprise linear or branched alkyls, cycloalkyls, aromatics, arenes, acrylates, or combinations thereof. For example $R^{14}$ may be:

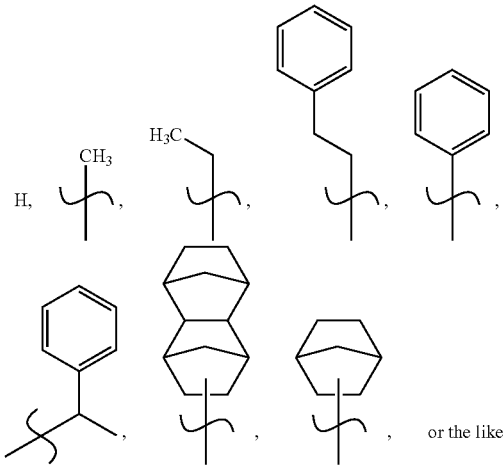

or the like.

The specific proportions and structures of $R^{12}$, $R^{13}$, and $R^{14}$ may be selected to provide a material suitable for photolithographic patterning processes.

In one embodiment, the second polymer of the polymer blend of this embodiment of positive-tone patternable low-k material may comprise a polymer of one monomer or a copolymer including at least two monomers and wherein the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane. In one embodiment, the second polymer of the polymer blend may comprise a copolymer of at least two monomers selected from siloxane, silane, silsesquioxane, carbosilane, or oxycarbosilane moieties. In one embodiment of the present invention, the second polymer of the polymer blend may comprise a copolymer of at least two monomers selected from an alkyltrialkoxysilane and/or a tetra-alkoxysilane. The molar ratio of the alkyltrialkoxysilane monomer in the copolymer ranges from 0 to 100%. The weight average molecular weight of the copolymer range from 100-5,000,000 g/mol, preferably 500-50,000 g/mol. Preferred copolymers are derived from at least two monomers selected from methyltrimethoxysilane, methyltriethoxysilane, ethyltrimethoxysilane, or ethyltriethoxysilane, as the alkyltrialkoxysilane monomer and tetra-methoxysilane or tetra-ethoxysilane, as the tetra-alkoxysilane monomer.

In another embodiment, the second polymer in the polymer blend for the positive-tone patternable low-k material is a polymer having the structural formula:

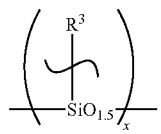

where $R^3$ may be a carbon functional group having at least one carbon atom and wherein the subscript x represents the number of repeating units and may be an integer greater than zero. The subscript q may be in a range from 4 to 50,000, such as from 10 to 1,000 for example. $R^3$ may comprise, for example, alkyls, cycloalkyls, aryl, or combinations thereof. Examples of $R^3$ include:

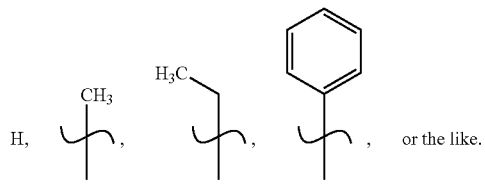

In one embodiment, the second silsesquioxane polymer may be poly(methylsilsesquioxane) or copolymer, where $R^3$ is a methyl group, and x is an integer from 4 to 1,000. In another embodiment, x may be greater than 1,000. The second silsesquioxane polymer may also comprise a copolymer with siloxane, silane, carbosilane, oxycarbosilane, alkyltrialkoxysilane, or tetra-alkoxysilane. The second silsesquioxane polymer or copolymer structure may be caged, linear, branched, or combinations thereof. The silsesquioxane polymers of the present invention may comprise end groups comprising silanols, halosilanes, acetoxysilanes, silylamines, alkoxysilanes, and combinations thereof, which may undergo condensation reactions in the presence of an acid generated by a photoacid generator under exposure to radiation, followed by thermal baking. Polymer molecules of the second polymer may undergo chemical crosslinking with molecules of the first polymer or copolymer, the second polymer or copolymer, or a combination of these. In one embodiment of the present invention, the second silsesquioxane may be the silsesquioxane polymer or copolymer LKD 2021, LKD-2056 or LKD 2064 (products of JSR Corporation) which contain silanol end groups.

The silsesquioxane polymers or copolymers in the polymer blend may have a weight averaged molecular weight in the range from 400 to 500,000 g/mol, such as from 1500 to 10,000 g/mol, for example.

Other components of a positive-tone patternable low-k material include a photo acid generator, a casting solvent and a base additive. These components and their compositions are well known to those skilled in the art and are similar to those in the negative-tone patternable low-k materials discussed previously.

The term "photo/acid-sensitive" is used throughout the application to denote imageable functional groups which undergo a chemical reaction in the presence of an acid generated by a photoacid generator under exposure to radiation. The acid-sensitive imageable functional groups employed may include acid-sensitive positive-tone functional groups or acid-sensitive negative-tone functional groups. The negative-tone acid-sensitive functional groups are functional groups for causing a crosslinking reaction which causes the exposed areas to be insoluble in a developer to form a negative-tone relief image after development. The positive-tone acid-sensitive functional groups are acid-sensitive protecting groups which cause the exposed region to be soluble in a developer to form positive-tone relief images after development.

In one preferred embodiment, a positive-tone patternable low-k material 18 is used for via patterning.

The aforementioned patternable low-k materials act as a photoresist during patterning; they can be positive-tone or negative-tone, and sensitive to G-line, I-line, DUV (248 nm, 193 nm, 157 nm, 126 nm, and EUV (13.4 µm), an electron beam, or an ion beam. The patterning by exposure with light through a mask can be in a dry mode or an immersion mode wherein a liquid with a refractive index larger than that of air is inserted between the patternable low-k and the lens of the exposure tool.

Figure 1B:
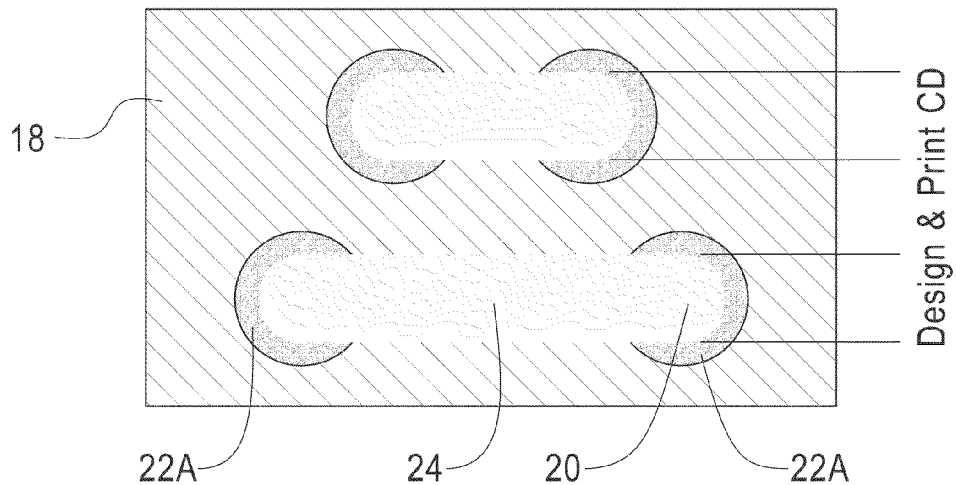
Figure 2C:
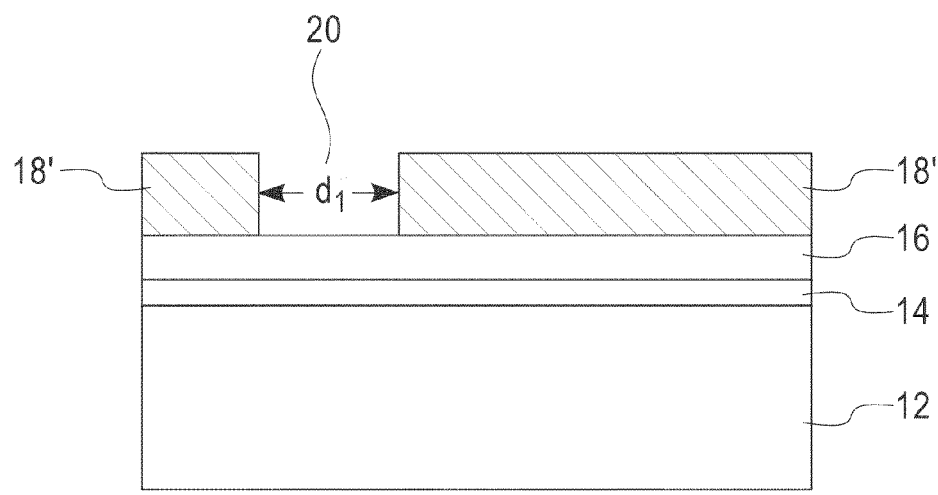

Next, and as shown in FIG. 2C and as previously shown in FIG. 1A, the first patternable low-k dielectric material 18 is pattern-wise exposed to form latent images of at least one first interconnect pattern, wherein the latent images of the at least one first interconnect pattern have a first dimension that is larger than a second dimension of a final first interconnect pattern. That is, latent images of a first interconnect pattern are first formed to have an enlarged critical dimension (CD) that is no less than the sum of the design CD for the first interconnect pattern and the mis-alignment margin or overlayer error, but no more than the CD that the first interconnect pattern will be in contact with its nearest neighbor first interconnect pattern. An optional post-exposure baking may be required to effect the photochemical reactions. When performed, the baking step is conducted at a temperature from 60° to 200° C., with a baking temperature from 80° to 140° C. being even more preferred. The duration of the baking step varies from 10 seconds to 600 seconds and is not critical to the practice of the present invention. After exposure and post-exposure baking, the latent images are developed into the patternable low-k material with a developer, usually 0.263N tetra-methyl-ammonium hydroxide.

The pattern-wise exposing process can be accomplished in a variety of ways, including, for example, through a mask with a lithography stepper or a scanner with an exposure light source of G-line, I-line (365 nm), DUV (248 nm, 193 nm, 157 nm, 126 nm), Extreme UV (13.4 nm), an electron beam, or an ion beam. The patterning by exposure with light through a mask can be in a dry mode or an immersion mode wherein a liquid with a refractive index larger than that of air is inserted between the patternable low-k and the lens of the exposure tool. The pattern-wise exposing process also includes direct writing without the use of a mask with, for example, light, electron beam, ion beam, and scanning probe lithography. Other patterning techniques that can be used in the present invention include contact printing techniques such as nanoimprint lithography, embroising, micro contact printing, replica molding, microtransfer molding, micromolding in capillaries and solvent-assisted micromolding, thermal assisted embroising, inject printing, and the like. These patterning techniques can be applied once or multiple times to form an interconnect structure. The multiple patterning can be accomplished with one patterning technique or a combination of the techniques.

Specifically, FIG. 2C illustrates the structure that is formed after forming the at least one first interconnect pattern 20 of the first dimension d, within the patternable low-k film 18. The at least one first interconnect pattern 20 having the first dimension is an enlarged first interconnect pattern that is designed to be larger than the final dimension of the first interconnect pattern. The at least one first interconnect pattern 20 exposes a surface of the ARC 16, if present. Typically, the first dimension of the at least one first interconnect pattern 20 formed is from 2 nm to 10000 nm, with a first dimension from 20 nm to 1000 nm being even more typical. The at least one first interconnect pattern 20 may be a via pattern or a trench pattern, with via patterns being highly preferred in some embodiments of the invention.

After forming the at least one first interconnect pattern 20 of the first dimension, the low-k material 18 is typically, but not necessarily always, cured forming a cured low-k material 18' (see, FIG. 2C). The curing is optional when the first patternable low-k material 18 is negative-tone, but it is required when the first patternable low-k material 18 is a positive-tone material.

Curing is performed by a thermal cure, an electron beam cure, an ultra-violet (UV) cure, an ion beam cure, a plasma cure, a microwave cure or a combination thereof. The conditions for each of the curing processes are well known to those skilled in the art and any condition can be chosen as long as it coverts the patternable low-k material into a low-k film with good electrical, physical, and mechanical properties. In other words, the cured patternable low-k material 18' must meet the requirements of an on-chip dielectric insulator, including electrical properties (low dielectric constant: preferably k less than 4.3, and more preferably k less than 3.6, most preferably k less than 2.7; dielectric breakdown field: greater than 2 MV/cm, preferably greater than 4 MV/cm, and more preferably greater than 6 MV/cm, leakage: less than $10^{-5}$ A/cm$^2$, preferably less than $10^{-7}$ A/cm$^2$, and more preferably less than $10^{-9}$ A/cm$^2$); mechanical properties (elastic modulus greater than 2 GPa, more preferably modulus greater than 4 GPa, most preferably modulus greater than 6 GPa; Hardness greater than 0.2 GPa, more preferably modulus greater than 0.4 GPa, most preferably modulus greater than 0.6 GPa; adhesion energy equal to or greater than the cohesive energy of the weakest layer of the integrated film stack; resistant to cracking); resistant to moisture absorption; must pass electrical and mechanical reliability tests.

In another embodiment, the cured patternable low-k material 18' contains microscopic pores generated by the added porogens or self-formed pores. The formation of the microscopic pores reduces dielectric constant of the cured patternable low-k material 18'.

In another embodiment, the irradiation cure step is performed by a combination of a thermal cure and an ultra-violet (UV) cure wherein the wavelength of the ultra-violet (UV) light is from 50 to 300 nm and the light source for the ultra-violet (UV) cure is a UV lamp, an excimer (exciplex) laser or a combination thereof.

In one embodiment, this post patterning cure is a combined UV/thermal cure. This combined UV/thermal cure is carried on a UV/thermal cure module under vacuum or inert atmosphere, such as $N_2$, He, Ar or by vacuum. Typically, the UV/thermal cure temperature is from 100° C. to 500° C., with a cure temperature from 300° to 450° C. being more typical. The duration of the UV/thermal cure is from 0.5 min to 30 min with a duration from 1 min to 10 min being more typical. The UV cure module is designed to have a very low oxygen content to avoid degradation of the resultant dielectric materials.

The excimer laser may be generated from at least one of the excimers selected from the group consisting of $Ar_2^*$, $Kr_2^*$, $F_2$, $Xe_2^*$, ArF, KrF, XeBr, XeCl, XeCl, XeF, $CaF_2$, KrCl, and $Cl_2$ wherein the wavelength of the excimer laser is in the range from 50 nm to 300 nm. Additionally, the light of the ultra-violet (UV) cure may be enhanced and/or diffused with a lens or other optical diffusing device known to those skilled in the art.

Figure 2D:
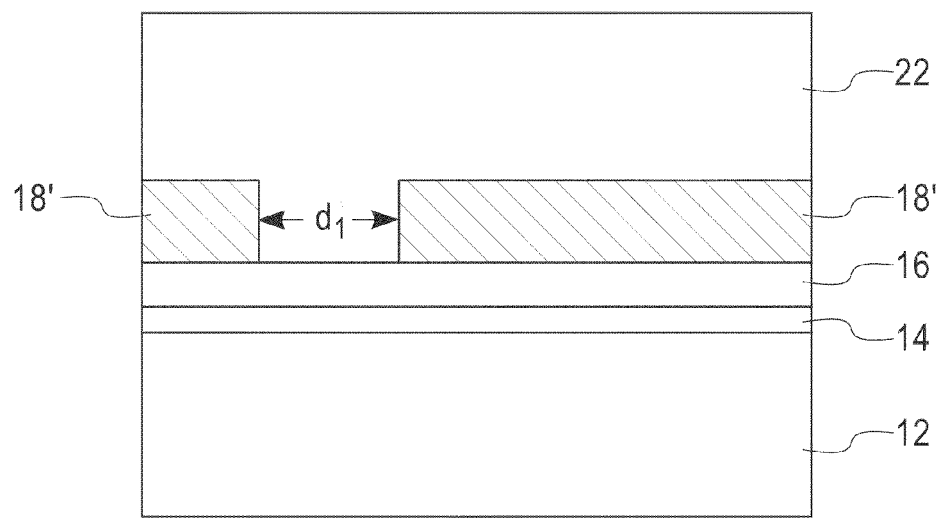

After patterning and optionally curing the first patternable low-k material 18, a second patternable low-k material 22 is then formed providing the structure shown in FIG. 2D. As shown, the second patternable low-k material completely fills the at least one via pattern 20 and extends onto an upper surface of the first patternable low-k material. The second patternable low-k material 22 may comprise the same or different material as the first patternable low-k material 18. The deposition processes and thickness mentioned above for the first patternable low-k material 18 are each applicable here for the second patternable low-k material 22. Typically, the first patternable low-k material 18 is a positive-tone material, and the second low-k material 22 is either a negative-tone or a positive-tone material.

Figure 2E:
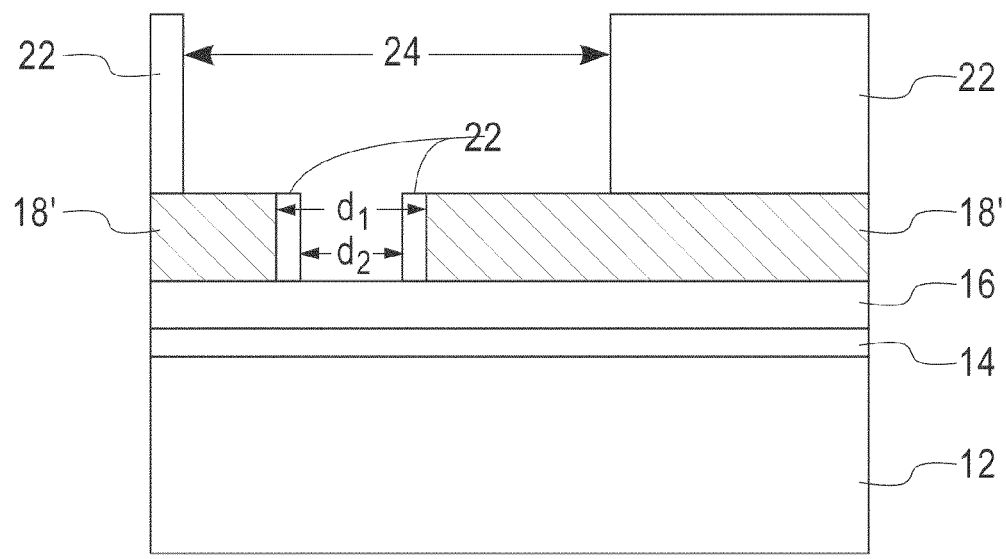

Next, and as shown in FIG. 2E, the second patternable low-k dielectric material 22 is patterned to form at least one second interconnect pattern 24 within the second patternable low-k dielectric material 22. It is noted that during the at least one second interconnect pattern 24 formation a portion of the second patternable low-k material remains in the at least one first interconnect pattern 20 of the first dimension providing a final interconnect via pattern having a second dimension $d_2$ which is less than the first dimension $d_1$ mentioned above. The patterning of the second patternable low-dielectric material 22 is performed utilizing the same basic processing equipment, conditions and steps as those used for patterning the first patternable low-k dielectric material 18. The at least one second interconnect pattern 24 is the other of a via pattern or a trench pattern not employed as the at least one first interconnect pattern 20.

Figure 2F:
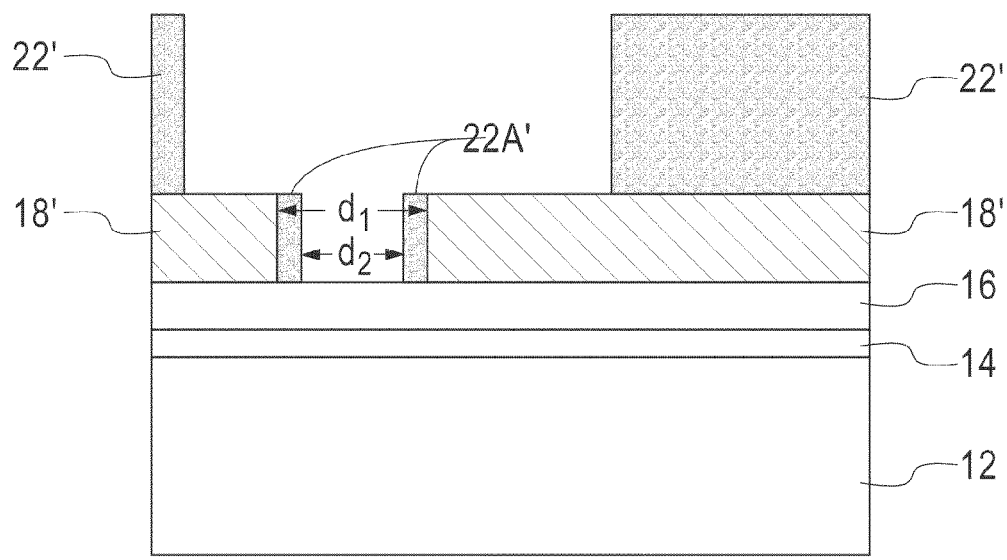

After patterning the second patternable low-k material 22, the structure is cured providing the structure shown in FIG. 2F. In FIG. 2F, reference numeral 22' denotes the cured second low-k material. Note that some portion of the cured second patternable low-k dielectric remains on the sidewalls of the at least one first interconnect pattern 20 as shown in FIG. 2F. The remaining cured second low-k patternable low-k material that remains in the at least one first interconnect pattern 20 is designated as element 22A'. Like the first cured low-k material 18', the cured second low-k material 22' including 22A' has a dielectric constant within the ranges mentioned above. If not previously cured, this curing step also cures the first patternable low-k material 18 into a cured low-k material 18'. The resulting structure now has a first interconnect pattern that has a dimension $d_2$ that is preferably closer to the design CD and self-aligned to the second interconnect pattern 24.

Figure 2G:
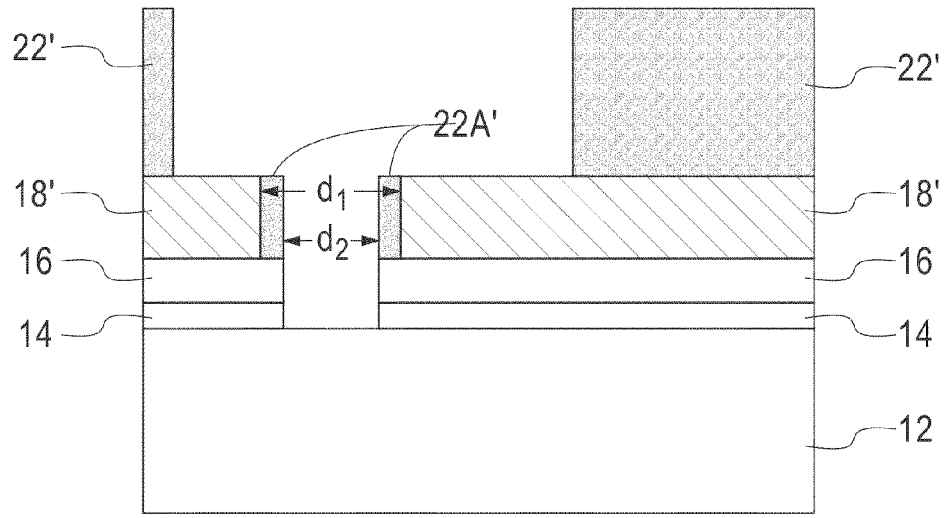

After the dual-damascene interconnect structure is formed, via contacts are formed through the ARC/cap layer to form contact with the underlying substrates (FIG. 2G). These via contacts can be formed with the reactive ion etching process well known to those skilled in the art.

Figure 3:
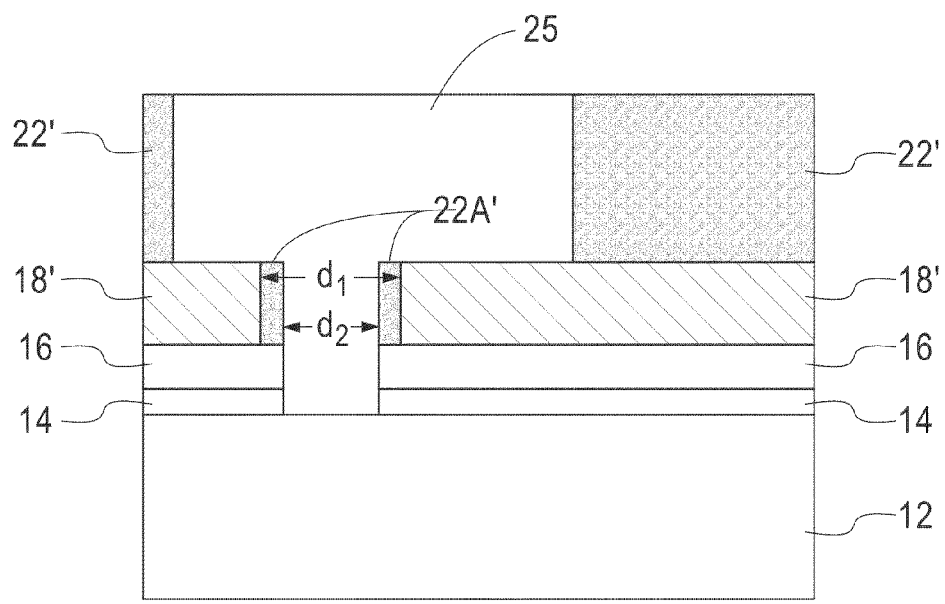
FIG. 3 is a pictorial representation (through a cross sectional view) depicting the self-aligned dual-damascene interconnect structure of FIG. 2G after further processing has been performed.

Further interconnect processing is then performed on the structure in FIG. 2G providing the structure shown in FIG. 3. In some embodiments, the substrate 12 illustrated in FIG. 3 may include a conductive feature embedded therein. When this embodiment is employed, layers 16 and 14 are first opened by etching via contacts (See, FIG. 2G) through those layers and exposing a surface of the conductive feature in the substrate 12 using the patterned and cured patternable low-k interconnect structure as an etch mask. The conductive material is then filled into the opening contacting the conductive material in the substrate 12. This includes etching through the ARC 16 and dielectric cap 14 if present, utilizing an etching process such as, for example, reactive ion etching. Next, a diffusion barrier liner (not shown), which may comprise Ta, TaN, Ti, TiN, Ru, RuTaN, RuTa, W, WN or any other material that can serve as a barrier to prevent conductive material from diffusing there through, is typically formed into the via and trench patterns by a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating. In some embodiments (not shown), the diffusion barrier liner may comprise a combination of layers. The thickness of the diffusion barrier liner may vary depending on the exact means of the deposition process employed as well as the material and number of layers employed. Typically, the diffusion barrier liner has a thickness from 4 to 40 nm, with a thickness from 7 to 20 nm being more typical.

Following the formation of the diffusion barrier liner, the remaining region of the via and trench patterns is filled with a conductive material 25 forming a conductive feature. The conductive material 25 used in forming the conductive feature includes, for example, polySi, a conductive metal, an alloy comprising at least one conductive metal, a conductive metal silicide or combinations thereof. Preferably, the first conductive material 25 that is used in forming the conductive feature is a conductive metal such as Cu, W or Al, with Cu or a Cu alloy (such as AlCu) being highly preferred in the present invention. The conductive material 25 is filled into the remaining via and trench patterns utilizing a conventional deposition process including, but not limited to CVD, PECVD, sputtering, chemical solution deposition or plating.

After deposition, a conventional planarization process such as, for example, chemical mechanical polishing (CMP) can be used to provide a structure in which the diffusion barrier liner and the conductive material 25 each have an upper surface that is substantially coplanar with the upper surface of the cured second low-k material 22'.

After forming the at least one conductive material 25, another dielectric cap (not shown) is formed on the surface of the cured second low-k material 22' utilizing a conventional deposition process such as, for example, chemical vapor deposition (CVD), plasma enhanced chemical vapor deposition (PECVD), atomic layer deposition (ALD), chemical solution deposition, or evaporation. The dielectric cap comprises any suitable dielectric capping material such as, for example, SiC, SiN, $SiO_2$, a carbon doped oxide, a nitrogen and hydrogen doped silicon carbide SiC(N,H) or multilayers thereof. This dielectric cap can be a continuous layer or a discontinuous layer. It can also be a select cap, such as CoWP. The thickness of the dielectric cap may vary depending on the technique used to form the same as well as the material make-up of the layer. Typically, the dielectric cap has a thickness from 5 to 55 nm, with a thickness from 20 to 45 nm being more typical.

Figure 4:
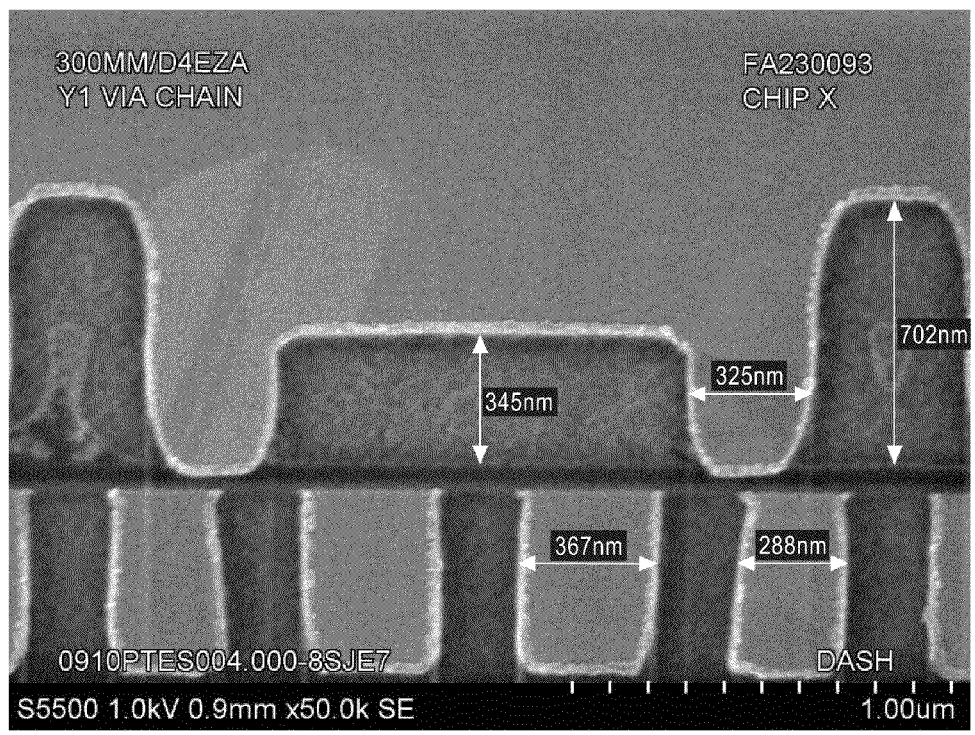
FIG. 4 is an actual SEM of a self-aligned interconnect structure as processed in FIGS. 2A-2G. The partially filled vias are clearly visible.

Reference is now made to FIG. 4 which is an actual SEM of a self-aligned dual-damascene interconnect structure after processing as described above in FIGS. 2A-2G. The partially filled via is clearly shown in this SEM.

While the present invention has been particularly shown and described with respect to preferred embodiments thereof it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A self-aligned interconnect structure comprising:

a patterned dielectric cap located on a surface of a substrate;

a patterned antireflective coating located on said patterned dielectric cap;

a first patterned and cured low-k material located on a surface of said patterned antireflective coating, wherein the first patterned and cured low-k material includes at least one first interconnect pattern therein and said at least one first interconnect pattern is located atop and is in communication with an opening located within both the patterned dielectric cap and the patterned antireflective coating;

a second patterned and cured low-k material having at least one second interconnect pattern that is different from the at least one first interconnect pattern located directly on an upper horizontal surface of the first patterned and cured low k material, wherein a portion of the second patterned and cured low-k material partially fills the at least one first interconnect pattern within the first patterned and cured low-k material and wherein said portion of the second patterned and cured low-k material that partially fills the at least one first interconnect pattern has an upper surface that is coplanar with the upper horizontal surface of the first patterned and cured low-k material and wherein said first patterned and cured low-k material, said second patterned and cured low-k material and said portion of the second patterned and low-k material are derived from a functionalized polymeric material including at least one acid-sensitive functional group; and a conductive material filling the at least one first interconnect pattern, the at least one second interconnect pattern and the opening present in the patterned antireflective coating and the patterned dielectric cap.

2. The self-aligned interconnect structure of claim 1 wherein each of said patterned and cured low-k materials is a cured patternable low-k material comprising a polymer, a copolymer, or a blend including at least two of any combination of polymers and/or copolymers, wherein said polymers include one monomer and said copolymers include at least two monomers and wherein said monomers of said polymers and said monomers of said copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

3. The self-aligned interconnect structure of claim 2 wherein said first and second patterned and cured low-k materials are each a cured patternable low-k material comprising the polymer having the general formula:

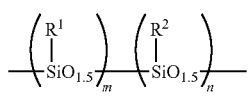

wherein m and n are integers greater than zero, $R^2$ is a group containing at least one carbon atom, wherein $R^1$ is selected from the group consisting of:

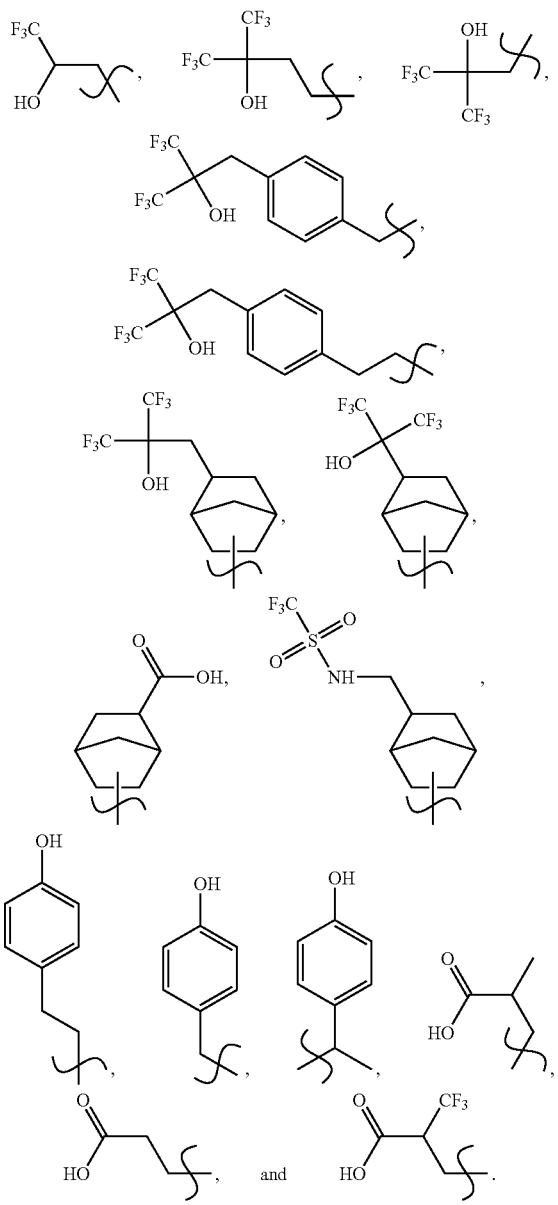

4. The self-aligned interconnect structure of claim 3 wherein said polymer is a first polymer of a polymer blend that further includes a second polymer, wherein said second polymer of said polymer blend is a polymer or a copolymer, wherein said polymer includes one monomer and said copolymer includes at least two of any combination of monomers and wherein said monomers of said polymers and said monomers of said copolymers are selected from siloxane, silane, silsesquioxane, carbosilane oxycarbosilane, alkyltrialkoxysilane and tetra-alkoxysilane.

5. The self-aligned interconnect structure of claim 3 wherein said polymer is a first polymer of a polymer blend that further includes a second polymer, wherein said second polymer of said polymer blend is a copolymer derived from at least two of any combination of monomers selected from methyltrimethoxysilane, methyltriethoxysilane, ethyltrimethoxysilane, or ethyltriethoxysilane, as an alkyltrialkoxysilane monomer, and tetra-methoxysilane or tetra-ethoxysilane, as an tetra-alkoxysilane monomer.

6. The self-aligned interconnect structure of claim 3 wherein said polymer is a first polymer of a polymer blend that further includes a second polymer, wherein said second polymer of said polymer blend is a silsesquioxane polymer having the general formula:

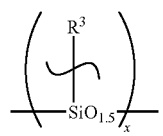

wherein x is an integer greater than zero and $R^3$ is a carbon functional group comprising at least one carbon atom, wherein said second polymer is configured to undergo chemical crosslinking with said first polymer, said second polymer, or a combination thereof.

7. The self-aligned interconnect structure of claim 6 wherein $R^3$ is selected from the group consisting of:

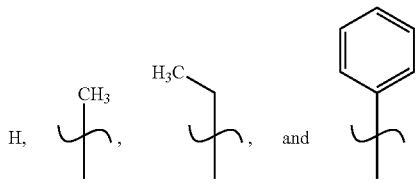

x is an integer from 4 to 1000.

8. The self-aligned interconnect structure of claim 2 wherein said first and second patterned and cured low-k materials are cured patternable low-k materials comprising a carbosilane-substituted silsesquioxane polymer having a structural formula:

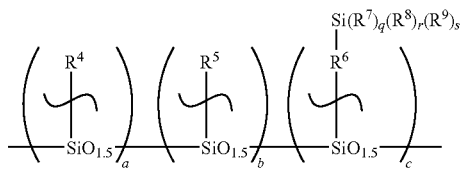

wherein, a, b, and c are integers greater than zero, wherein $R^4, R^5, R^6, R^7$, and $R^8$ are carbon-containing groups, and $R^9$ is an alkoxy group, wherein subscripts q and r are integers in a range from 0 to 3, and wherein subscript s is an integer in a range from 1 to 3.

9. The self-aligned interconnect structure of claim 8 wherein $R^4$ is selected from the group consisting of:

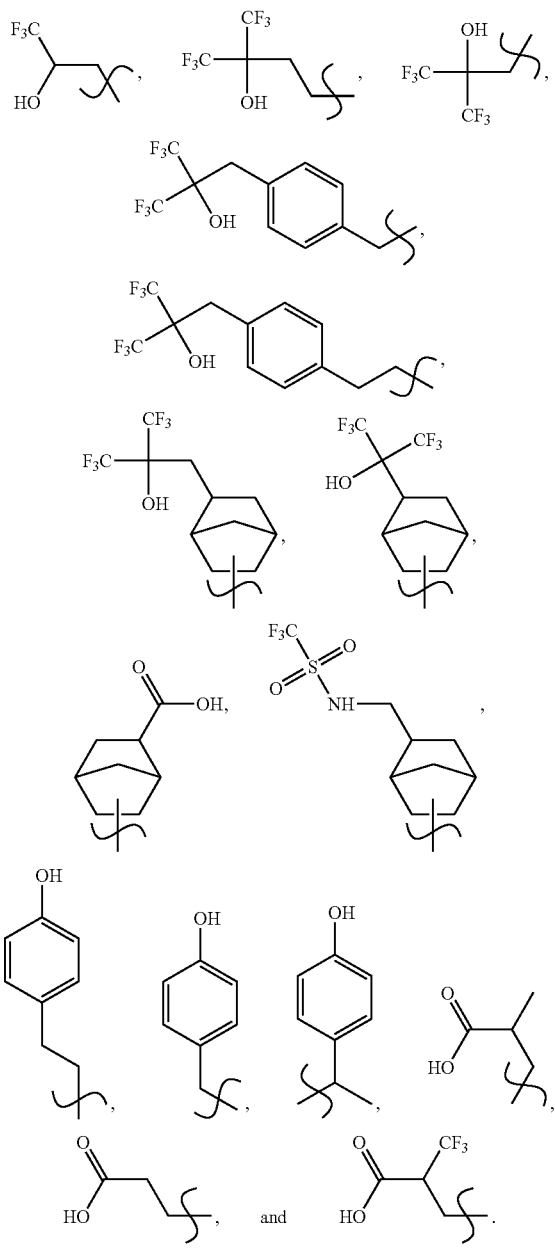

10. The self-aligned interconnect structure of claim 8 wherein $R^5$ is selected from the group consisting of:

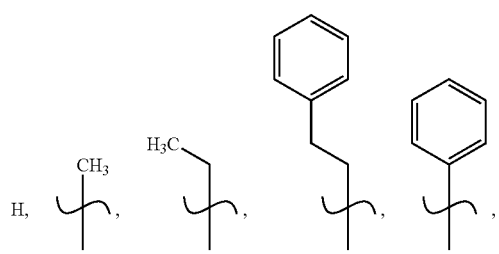

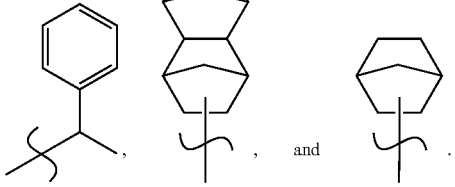

11. The self-aligned interconnect structure of claim 8 wherein said polymer is a first polymer of a polymer blend that further includes a second polymer, wherein said second polymer of said polymer blend is a polymer or a copolymer, wherein said polymer includes one monomer and said copolymer includes at least two of any combination of monomers and wherein said monomers of said polymers and said monomers of said copolymers are selected from siloxane, silane, silsesquioxane, carbosilane, oxycarbosilane, alkyltrialkoxysilane and tetra-alkoxysilane.

12. The self-aligned interconnect structure of claim 8 wherein said polymer is a first polymer of a polymer blend that further includes a second polymer, wherein said second polymer of said polymer blend is a copolymer derived from at least two of any combination of monomers selected from methyltrimethoxysilane, methyltriethoxysilane, ethyltrimethoxysilane, or ethyltriethoxysilane, as an alkyltrialkoxysilane monomer, and tetra-methoxysilane or tetra-ethoxysilane, as an tetra-alkoxysilane monomer.

13. The self-aligned interconnect structure of claim 2 wherein said first and second patternable low-k materials are cured positive-tone patternable low-k materials comprising a polymer described by the general formula:

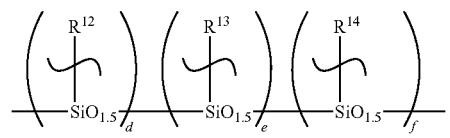

wherein, d and f are integers greater than zero, e is an integer greater than or equal to zero, $R^{12}$ is a carbon functionality having an acid-labile protecting group, $R^{14}$ is a carbon functionality having at least one carbon atom, $R^{13}$ is selected from the group consisting of:

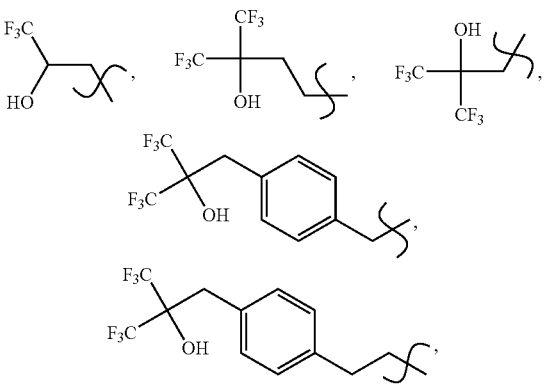

-continued

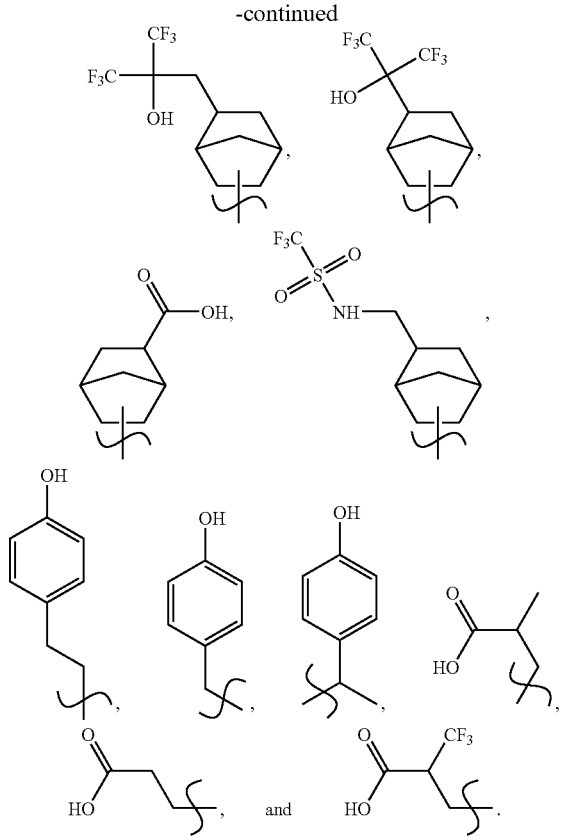

14. The self-aligned interconnect structure of claim 13 wherein said polymer is a first polymer of a polymer blend that further includes a second polymer, wherein said second polymer of said polymer blend is a polymer or a copolymer, wherein said polymer includes one monomer and said copolymer includes at least two of any combination of monomers and wherein said monomers of said polymers and said monomers of said copolymers are selected from siloxane, silane, silsesquioxane, carbosilane, oxycarbosilane, alkyltrialkoxysilane and tetra-alkoxysilane.

15. The self-aligned interconnect structure of claim 13 wherein said polymer is a first polymer of a polymer blend that further includes a second polymer, wherein said second polymer of said polymer blend is a copolymer derived from at least two of any combination of monomers selected from methyltrimethoxysilane, methyltriethoxysilane, ethyltrimethoxysilane, or ethyltriethoxysilane, as an alkyltrialkoxysilane monomer, and tetra-methoxysilane or tetra-ethoxysilane, as an tetra-alkoxysilane monomer.

16. The self-aligned interconnect structure of claim 13 wherein said second polymer is of said polymer blend is a silsesquioxane polymer having the general formula:

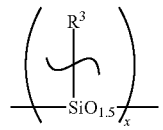

wherein x is an integer greater than zero and $R^3$ is a carbon functional group comprising at least one carbon atom, wherein said second polymer is configured to undergo chemical crosslinking with said first polymer, said second polymer, or a combination thereof.

17. The self-aligned interconnect structure of claim 1 wherein either said first or said second patterned and cured low-k materials or both are porous.

* * * * *